US009812461B2

(12) United States Patent
Doda et al.

(10) Patent No.: US 9,812,461 B2
(45) Date of Patent: Nov. 7, 2017

(54) HONEYCOMB CELL STRUCTURE THREE-DIMENSIONAL NON-VOLATILE MEMORY DEVICE

(71) Applicant: SANDISK TECHNOLOGIES INC., Plano, TX (US)

(72) Inventors: Yasushi Doda, Yokkaichi (JP); Ryoichi Honma, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 62 days.

(21) Appl. No.: 14/660,023

(22) Filed: Mar. 17, 2015

(65) Prior Publication Data
US 2016/0276360 A1  Sep. 22, 2016

(51) Int. Cl.
*H01L 29/792* (2006.01)
*H01L 27/11582* (2017.01)
(Continued)

(52) U.S. Cl.
CPC .... *H01L 27/11582* (2013.01); *H01L 27/1157* (2013.01); *H01L 27/11565* (2013.01); *H01L 29/513* (2013.01)

(58) Field of Classification Search
CPC ......... H01L 27/11582; H01L 27/11517; H01L 27/11519; H01L 27/11563; H01L 27/11565; H01L 21/28282; H01L 21/768
See application file for complete search history.

(56) References Cited

U.S. PATENT DOCUMENTS 5,406,104 A * 4/1995 Hirota ................. H01L 29/0696
257/335
5,915,167 A   6/1999 Leedy
(Continued)

FOREIGN PATENT DOCUMENTS

EP   2819169 A2   12/2014
JP   2010-034112   2/2010
(Continued)

OTHER PUBLICATIONS

Invitation to Pay Additional Fees and Where Applicable, Protest Fee and Communication Relating to the Results of the Partial International Search for PCT/US2015/062541, 7 pages, dated Apr. 1, 2016.
(Continued)

*Primary Examiner* — Jesse Y Miyoshi
*Assistant Examiner* — Tuan A Hoang
(74) *Attorney, Agent, or Firm* — The Marbury Law Group PLLC

(57) ABSTRACT

A monolithic three-dimensional memory device includes a plurality of memory stack structures arranged in a hexagonal lattice and located over a substrate. The hexagonal lattice structure is defined by hexagons each having a pair of sides that are parallel to a first horizontal direction and perpendicular to a second horizontal direction, the memory stack structures are located at vertices of the hexagonal lattice, and each memory stack structure includes vertically spaced memory elements and a vertical semiconductor channel. Source contact via structures are located at each center of a subset of the hexagons that forms a one-dimensional array that extends along the second horizontal direction, each source contact via structure being electrically shorted to a respective source region over, or within, the substrate.

34 Claims, 34 Drawing Sheets

(51) Int. Cl.
*H01L 27/11565* (2017.01)
*H01L 29/51* (2006.01)
*H01L 27/1157* (2017.01)

(56) References Cited

U.S. PATENT DOCUMENTS

| | | | |
|---|---|---|---|
| 8,030,700 B2 | 10/2011 | Sakamoto | |
| 8,284,601 B2 | 10/2012 | Son et al. | |
| 8,304,348 B2 | 11/2012 | Hashimoto | |
| 8,518,812 B2 * | 8/2013 | Mariani | H01L 45/06 257/E21.655 |
| 8,787,082 B2 | 7/2014 | Son et al. | |
| 8,946,665 B2 * | 2/2015 | Shim | H01L 29/7827 257/1 |
| 2012/0049268 A1 | 3/2012 | Chang et al. | |
| 2014/0264525 A1 | 9/2014 | Takahashi et al. | |
| 2014/0273373 A1 | 9/2014 | Makala et al. | |
| 2015/0001460 A1 * | 1/2015 | Kim | H01L 27/11578 257/5 |
| 2015/0340376 A1 * | 11/2015 | Park | H01L 27/11582 257/329 |
| 2016/0225786 A1 * | 8/2016 | Lee | H01L 27/11582 |

FOREIGN PATENT DOCUMENTS

| | | |
|---|---|---|
| JP | 2011-035237 | 2/2011 |
| JP | 2011-049561 | 3/2011 |
| WO | WO 2009/085078 A1 | 7/2009 |

OTHER PUBLICATIONS

Endoh, et al., "Novel Ultra High Density Memory with a Stacked-Surrounding Gate Transistor (S-SGT) Structured Cell," IEDM Proc. (2001) 33-36.

Notification of Transmittal of the International Search Report and Written Opinion of the Search Authority for International Application No. PCT/US2015/062541, 19 pages, dated Jun. 8, 2016.

* cited by examiner

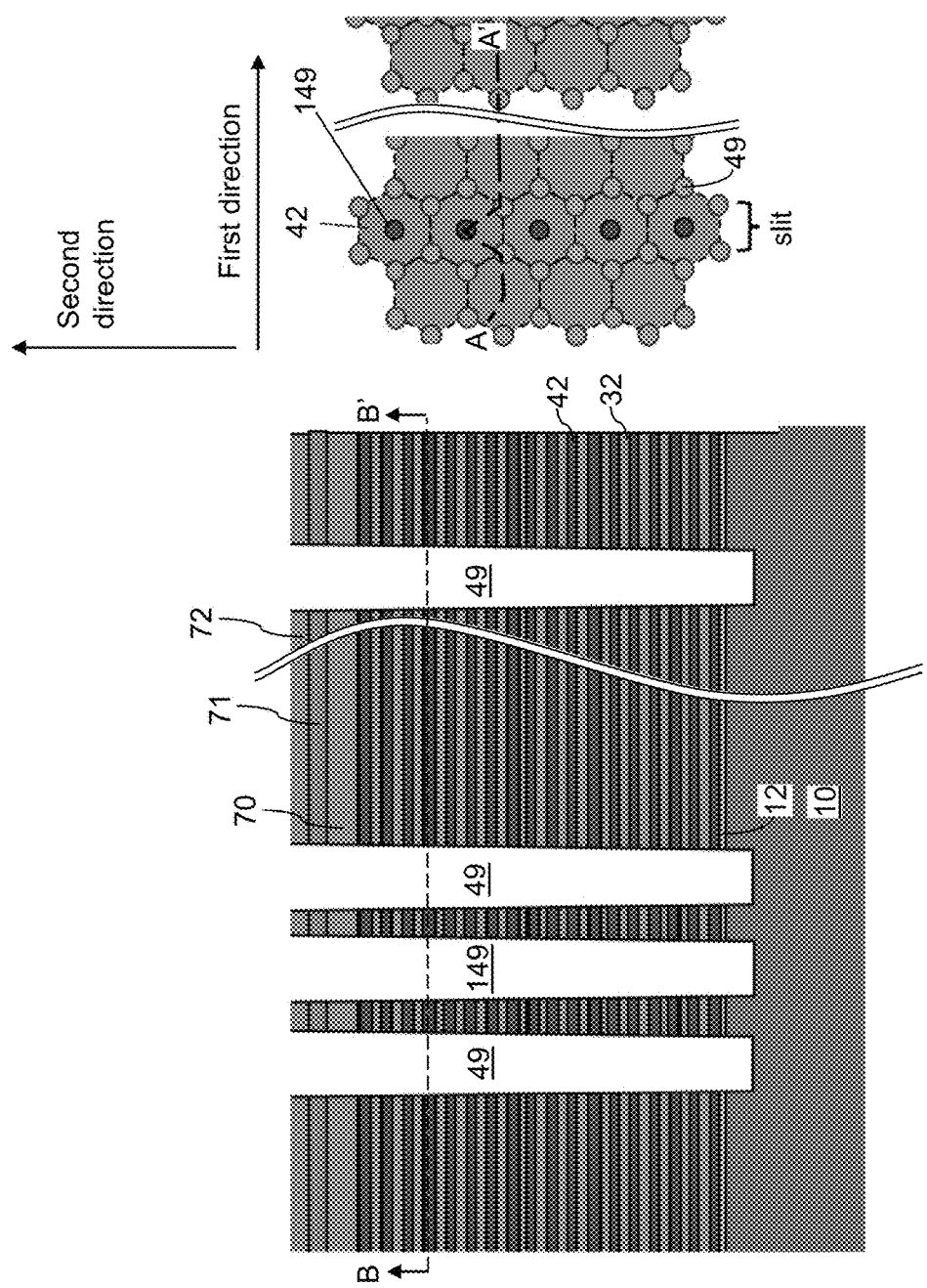

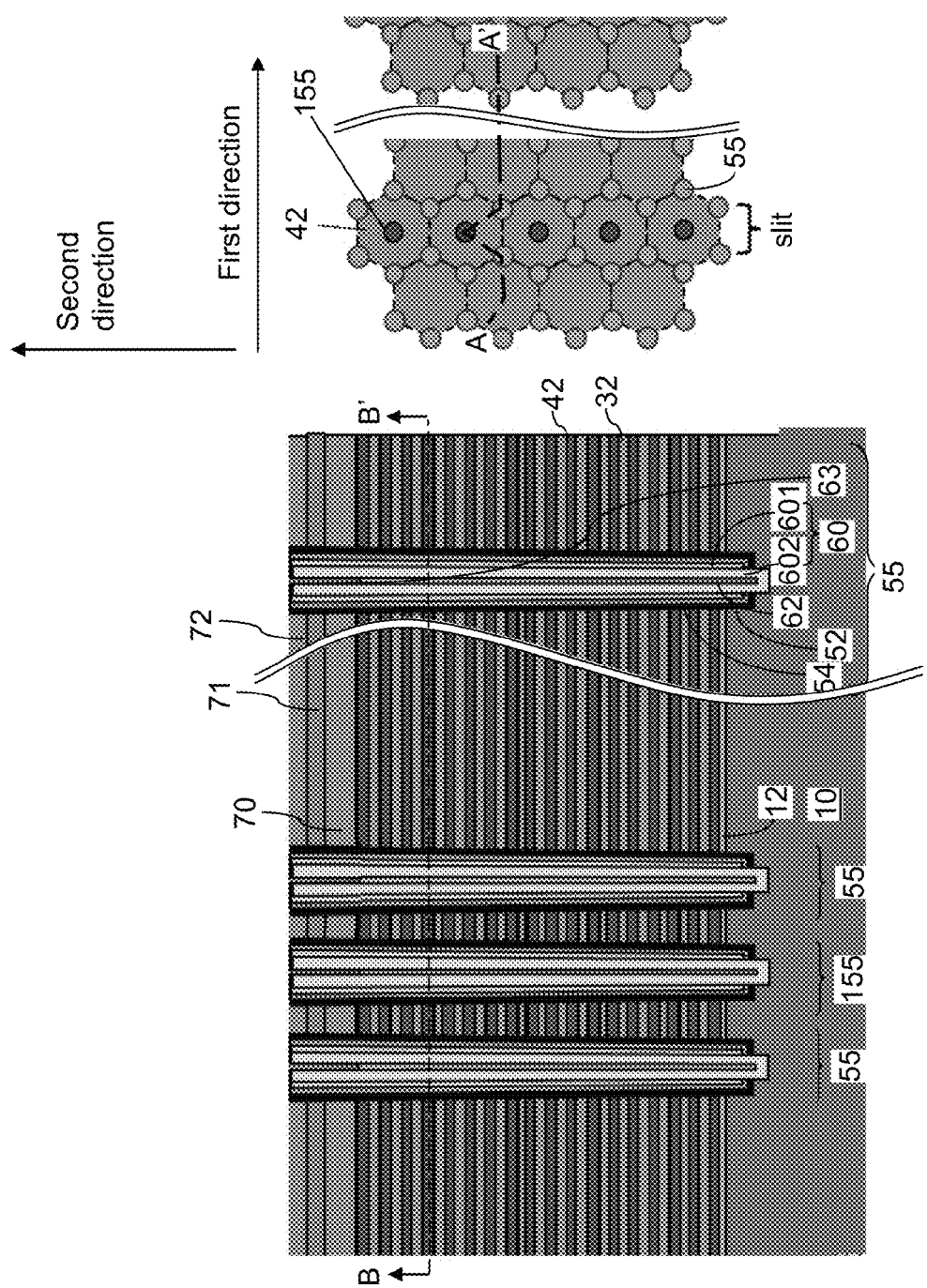

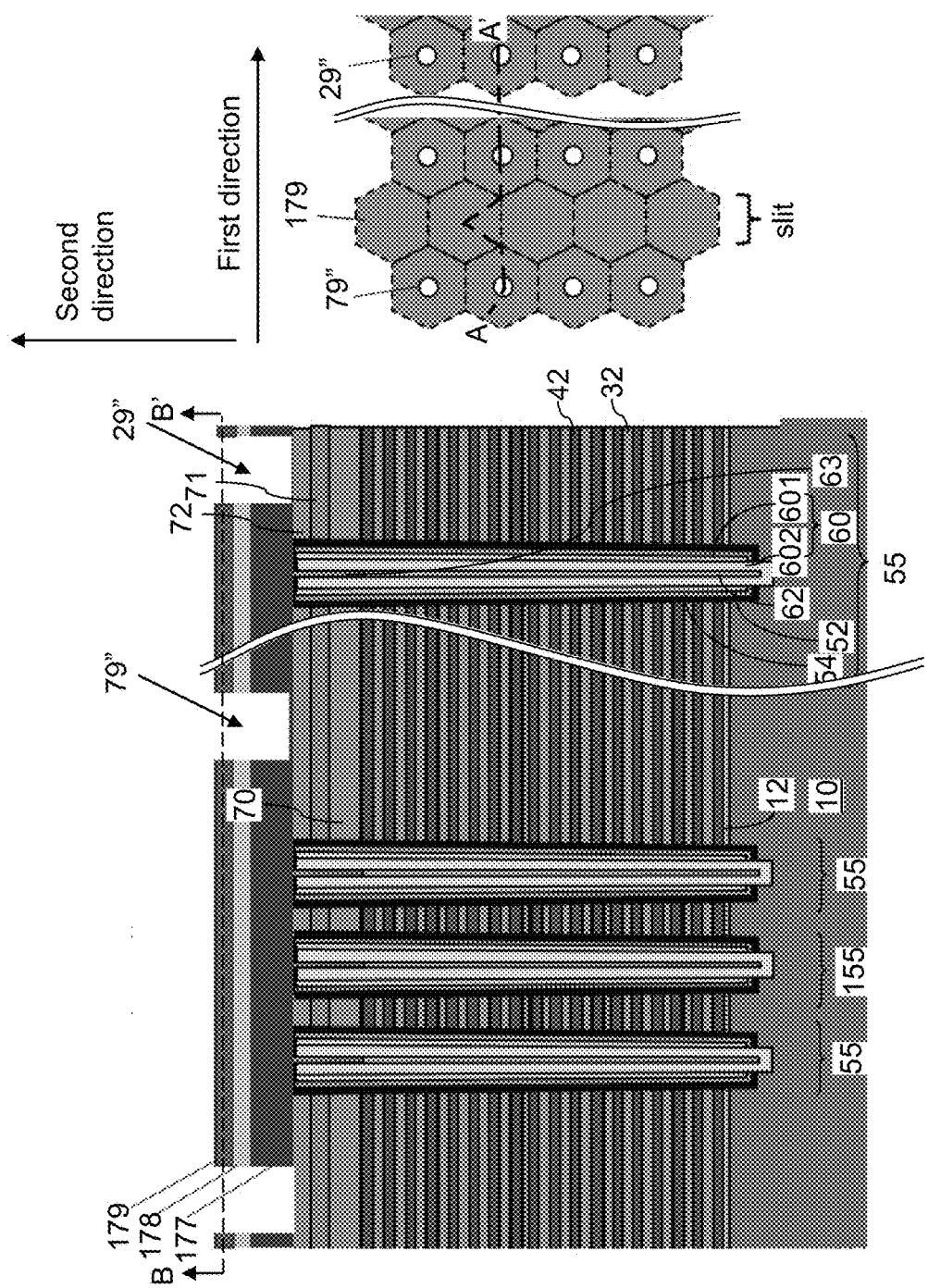

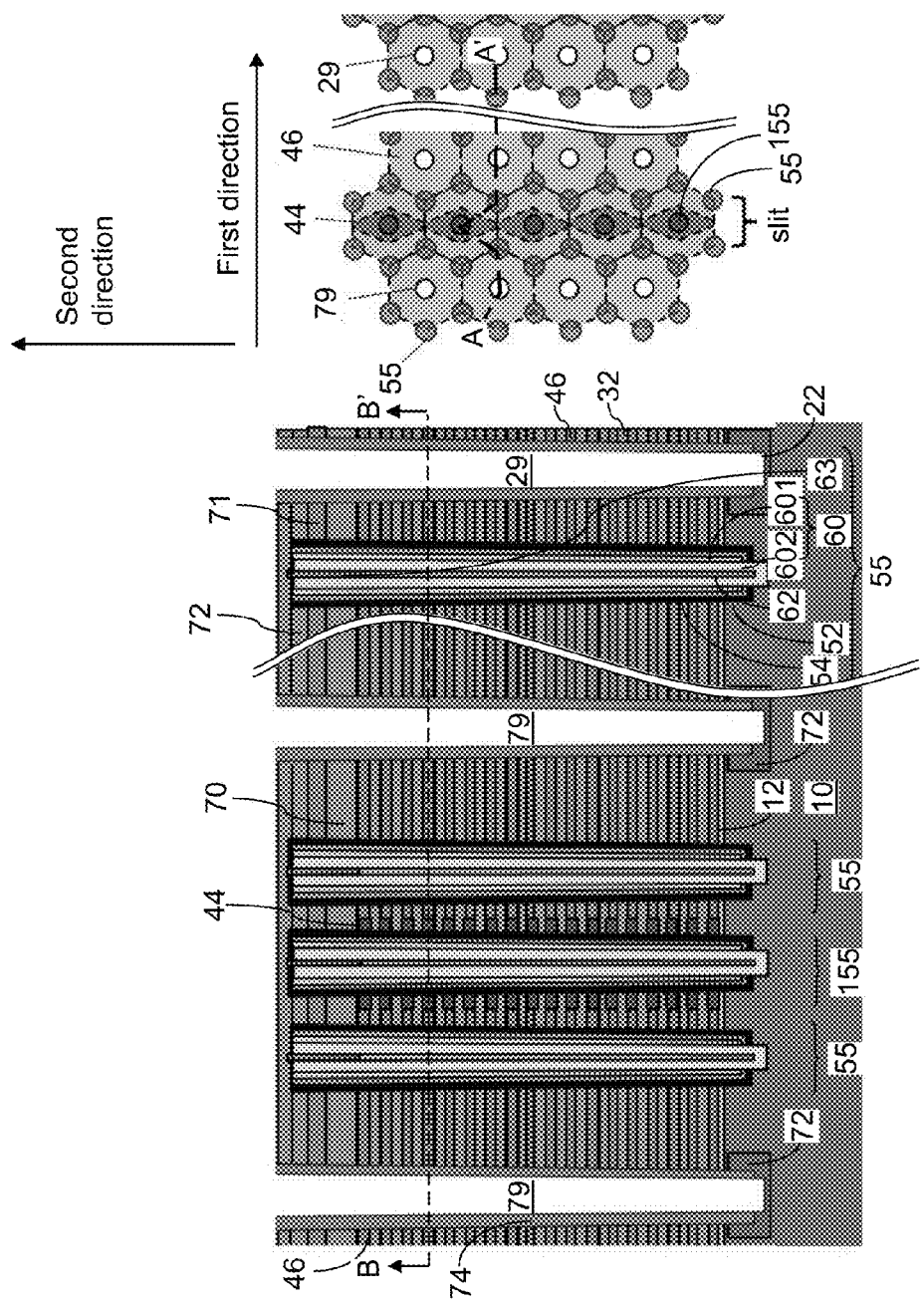

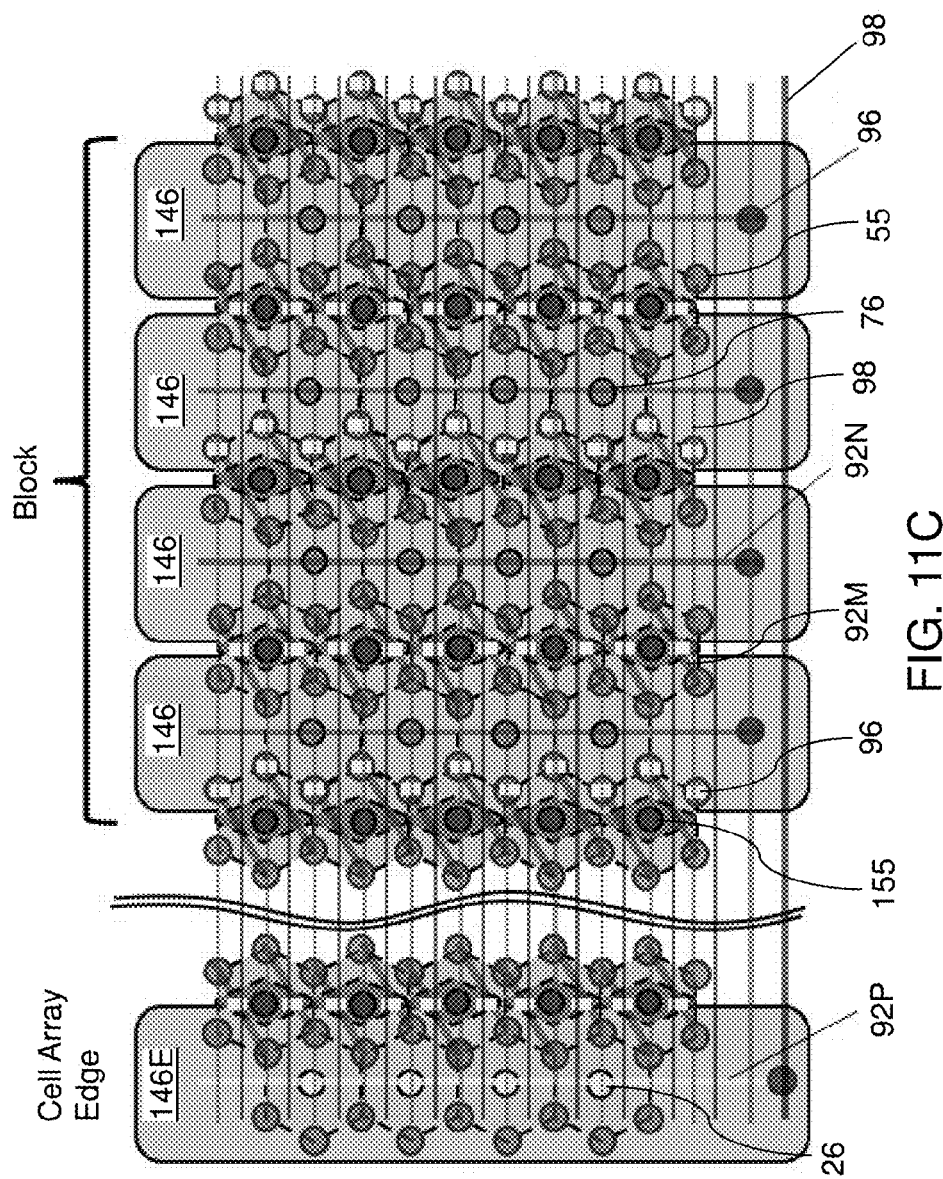

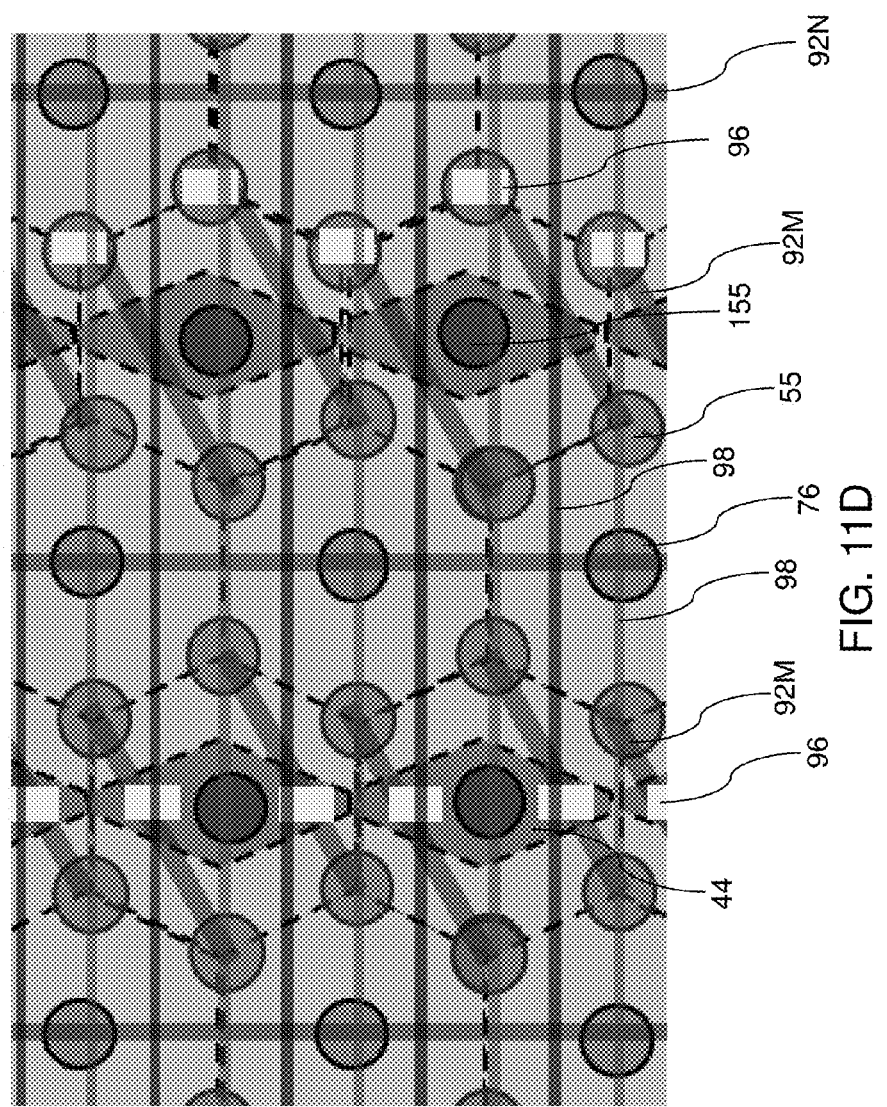

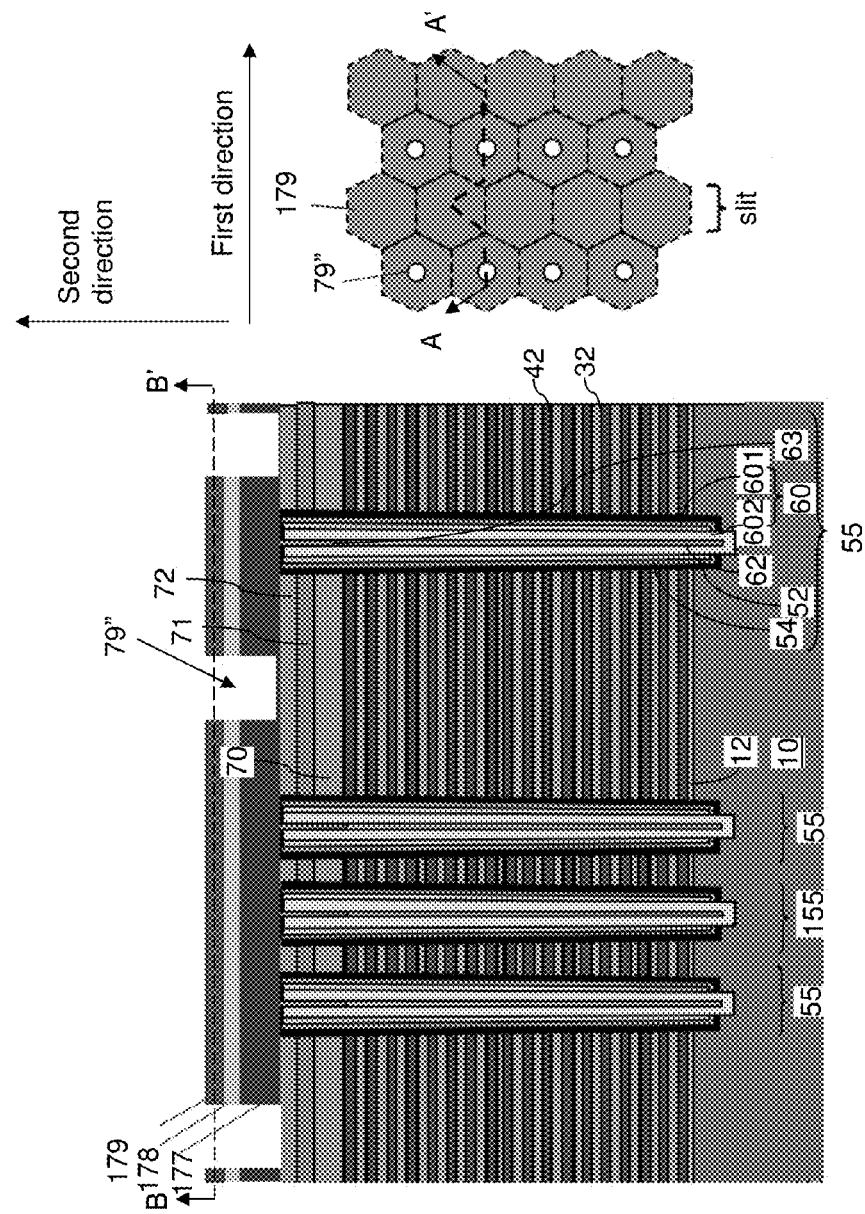

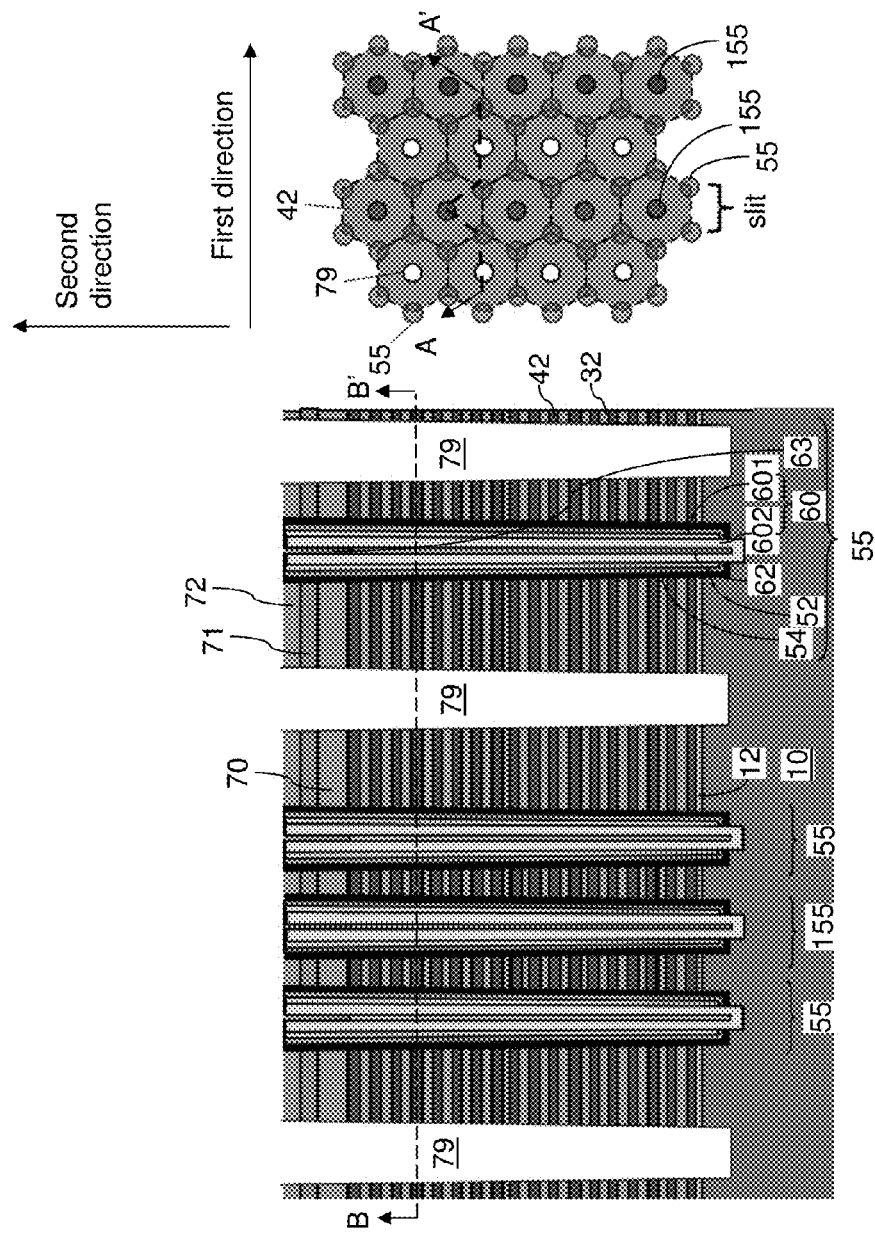

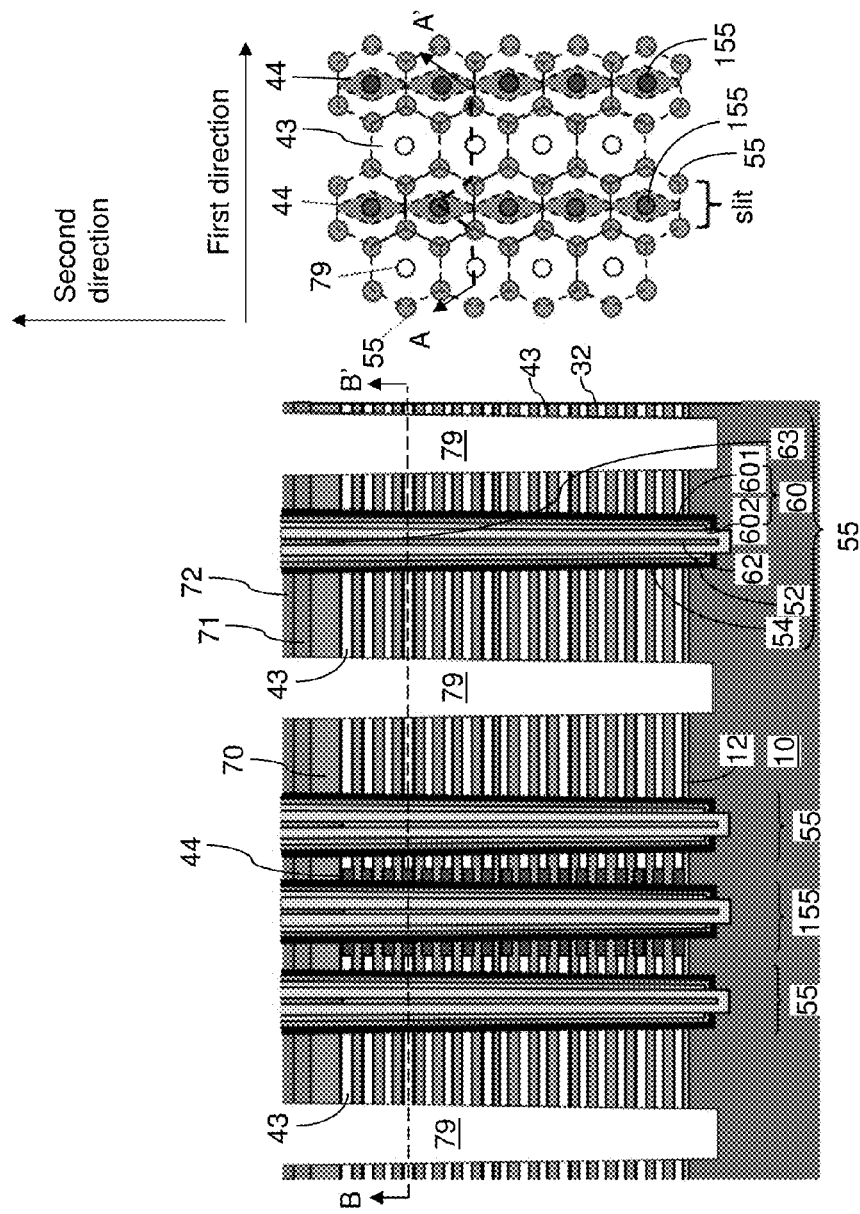

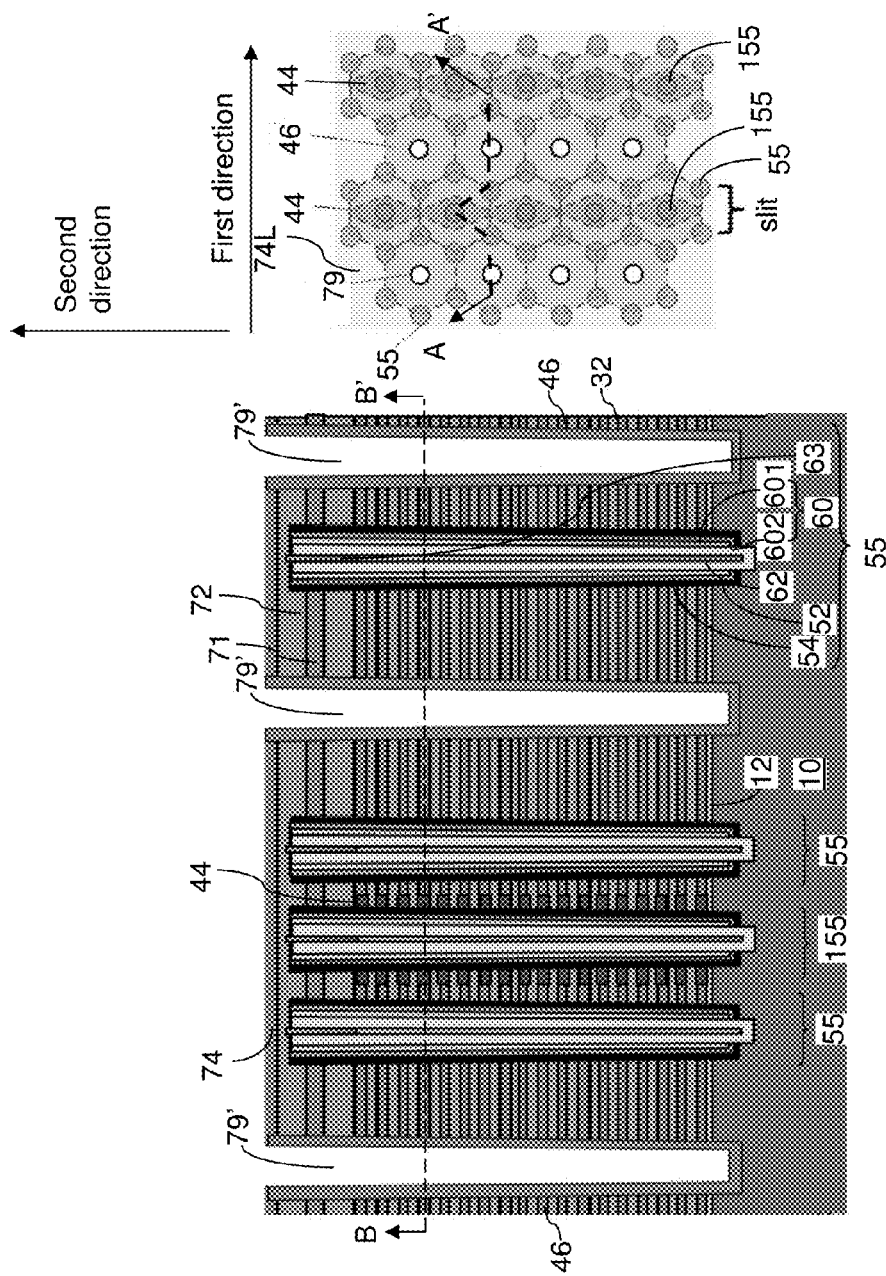

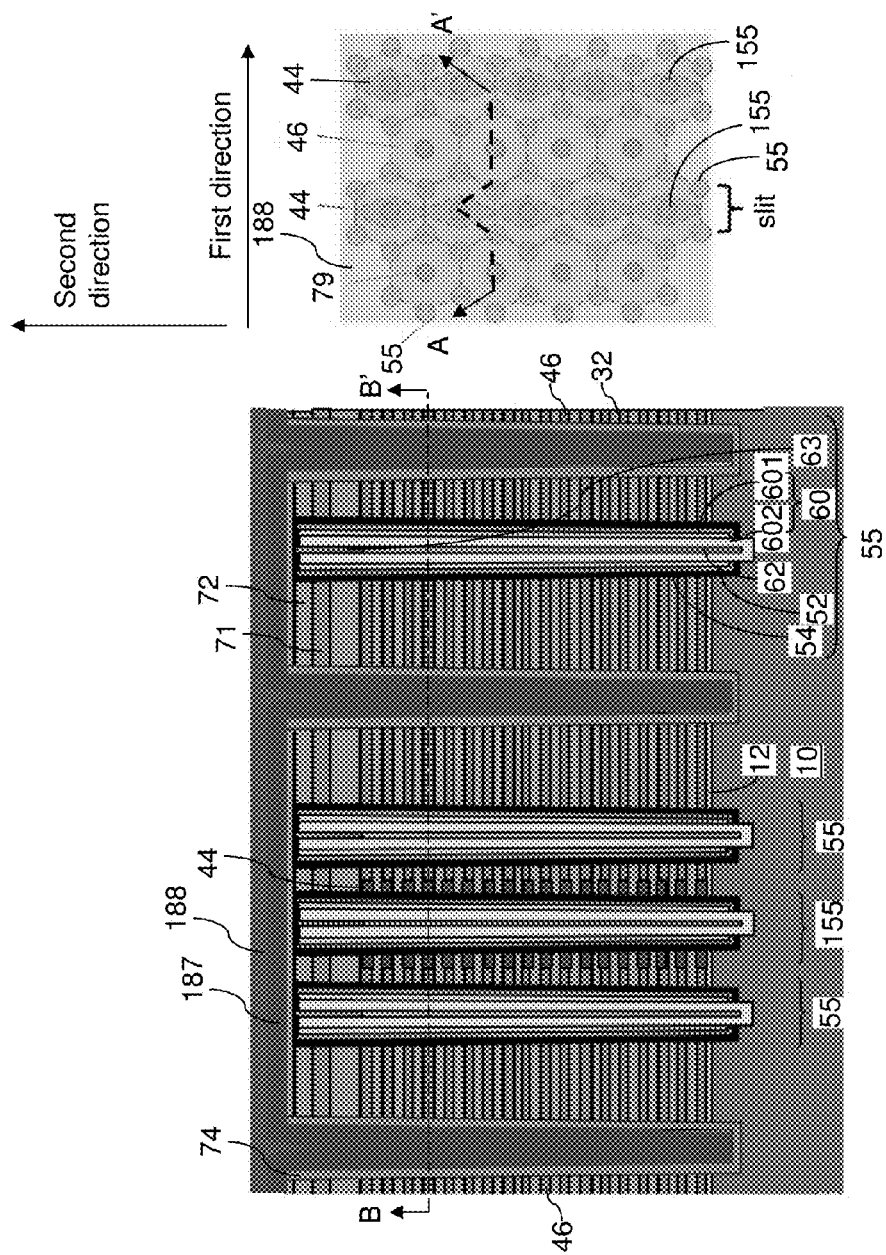

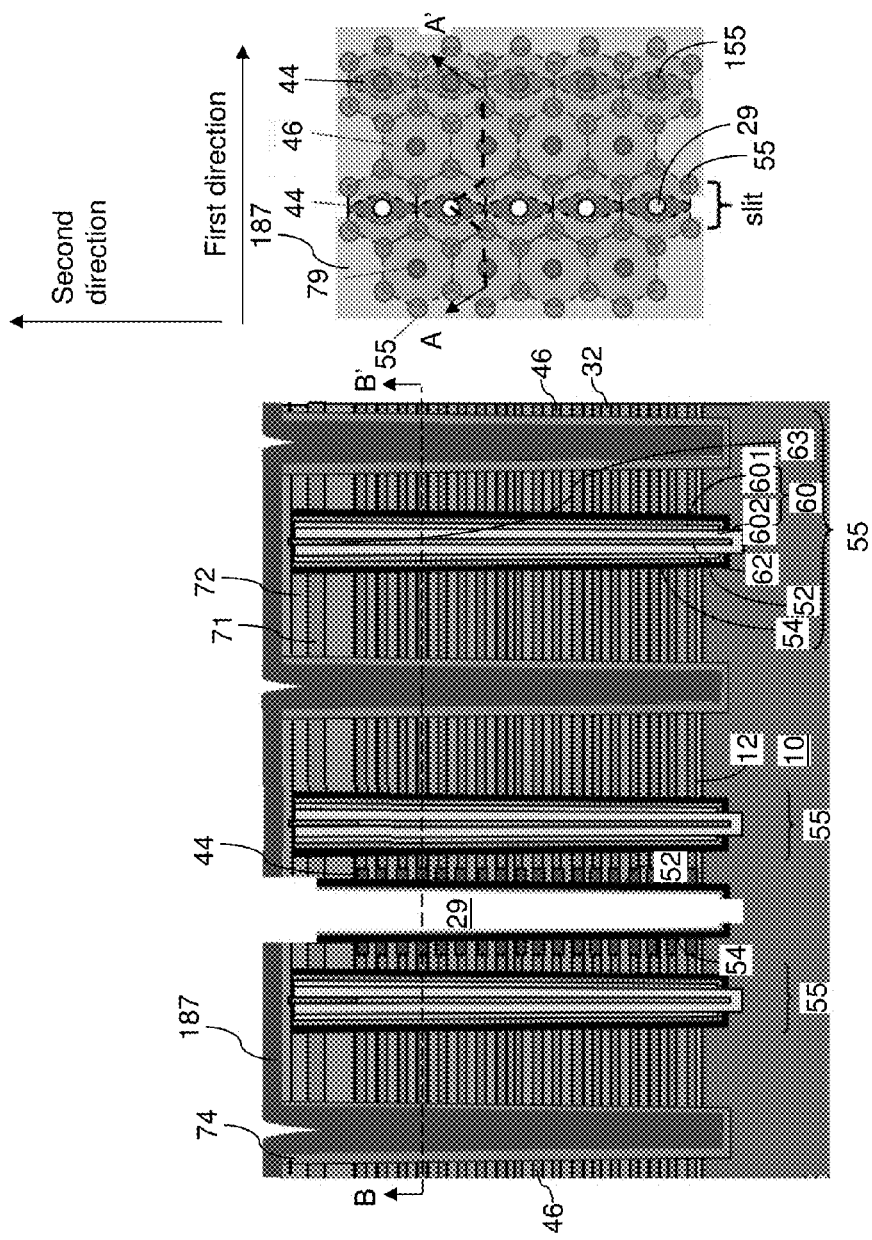

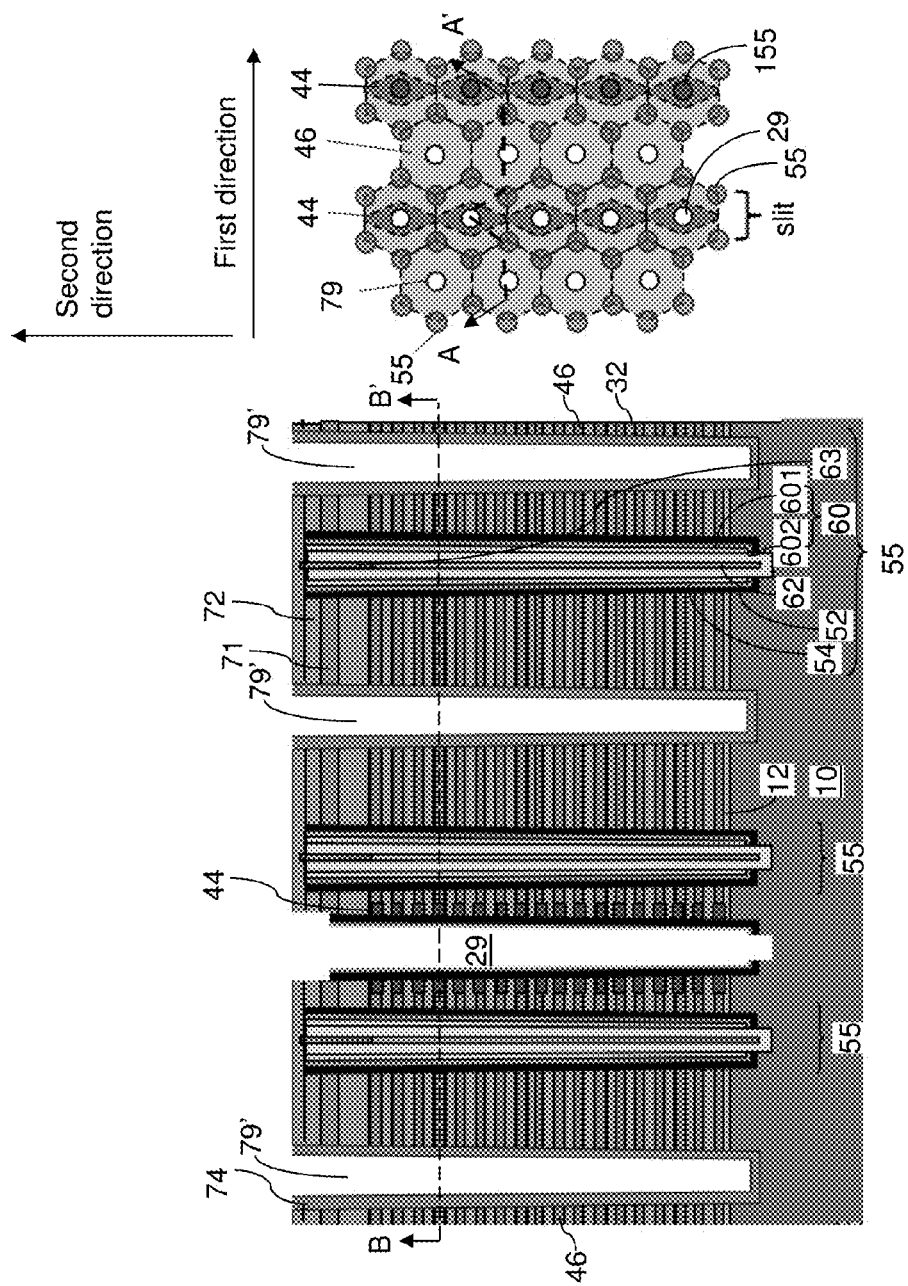

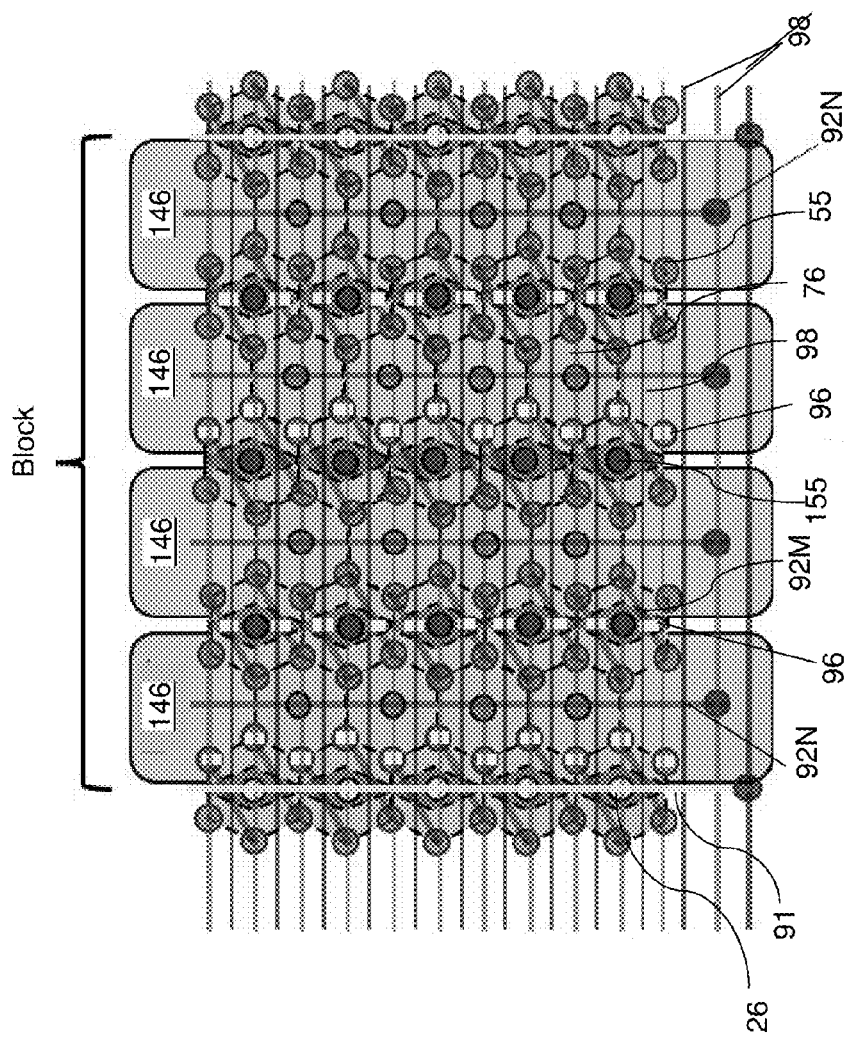

HONEYCOMB CELL STRUCTURE THREE-DIMENSIONAL NON-VOLATILE MEMORY DEVICE

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises: a stack of an alternating plurality of insulator layers and electrically conductive layers located over a substrate; a plurality of memory stack structures located at vertices of hexagons of a hexagonal lattice and over the substrate; and a plurality of dummy memory stack structures located at each center of a first subset of the hexagons. Each of the memory stack structure and the dummy memory stack structures comprises a memory film and a vertical semiconductor channel. The electrically conductive layers contact outer sidewalls of the plurality of memory stack structures. Outer sidewalls of the plurality of dummy memory stack structures are laterally spaced from the electrically conductive layers by a vertically spaced stack of dielectric material portions.

According to another aspect of the present disclosure, a monolithic three-dimensional memory device comprising a plurality of memory stack structures arranged in a hexagonal lattice and located over a substrate is provided. The hexagonal lattice structure is defined by hexagons each having a pair of sides that are parallel to a first horizontal direction and perpendicular to a second horizontal direction. The memory stack structures are located at vertices of the hexagonal lattice. Each memory stack structure comprises vertically spaced memory elements and a vertical semiconductor channel. Source contact via structures are located at each center of a subset of the hexagons that forms a one-dimensional array that extends along the second horizontal direction, each source contact via structure being electrically shorted to a respective source region over, or within, the substrate.

According to yet another aspect of the present disclosure, a method of manufacturing a three-dimensional memory structure is provided. A stack of alternating layers comprising first material layers and second material layers comprising a dielectric material is formed over a substrate. Memory openings and dummy memory openings are through the stack. The memory openings are formed at vertices of hexagons of a hexagonal lattice. A memory stack structure comprising a vertical semiconductor channel is formed in each memory opening and in each dummy memory opening. Backside recesses are formed by removing the second material layers selective to the first material layers. A dielectric material portion laterally surrounding the dummy memory openings is formed by a contiguous remaining portion of each second material layer. Electrically conductive layers are formed within the backside recesses and over sidewalls of the dielectric material portion.

BRIEF DESCRIPTION OF THE DRAWINGS

For FIGS. 1A-10B and 12A-25B, a zigzag vertical plane for each vertical cross-sectional view with the suffix "A" is shown as the plane A-A' in the corresponding figure with the same figure numeral and the suffix "B," and the horizontal cross-sectional plane for each full or partial horizontal cross-sectional view with the suffix "B" is shown as the plane B-B' in the corresponding figure with the same figure numeral and the suffix "A."

FIG. 1A is a schematic vertical cross-sectional view of a first exemplary structure after formation of memory openings and dummy memory openings according to a first embodiment of the present disclosure.

FIG. 1B is a schematic horizontal cross-sectional view of the first exemplary structure of FIG. 1A with a juxtaposed hexagonal lattice structure according to the first embodiment of the present disclosure.

FIG. 2A is a schematic vertical cross-sectional view of the first exemplary structure after formation of memory stack structures and dummy memory stack structures in the memory openings and dummy memory openings, respectively, according to the first embodiment of the present disclosure.

FIG. 2B is a schematic horizontal cross-sectional view of the first exemplary structure of FIG. 2A with a juxtaposed hexagonal lattice structure according to the first embodiment of the present disclosure.

FIG. 3A is a schematic vertical cross-sectional view of the first exemplary structure after formation of a patterned lithographic material stack according to the first embodiment of the present disclosure.

FIG. 3B is a schematic top-down view of the first exemplary structure of FIG. 3A with a juxtaposed hexagonal lattice structure according to the first embodiment of the present disclosure.

FIG. 9A is a schematic vertical cross-sectional view of the first exemplary structure after an anisotropic etch that removes bottom portions of the conformal dielectric material layer and removal of the non-conformal hard mask layer according to the first embodiment of the present disclosure.

FIG. 9B is a schematic horizontal cross-sectional view of the first exemplary structure of FIG. 9A with a juxtaposed hexagonal lattice structure according to the first embodiment of the present disclosure.

FIG. 11C is a juxtaposition of the horizontal cross-sectional view of FIG. 11B with a wiring schematic for the various metal interconnect structures according to the first embodiment of the present disclosure.

FIG. 11D is a magnified view of a portion of the wiring schematic of FIG. 11C according to the first embodiment of the present disclosure.

FIG. 12A is a vertical cross-sectional view of a second exemplary structure after formation of a patterned lithographic material stack according to a second embodiment of the present disclosure.

FIG. 12B is a schematic top-down view of the second exemplary structure of FIG. 12A with a juxtaposed hexagonal lattice structure according to the second embodiment of the present disclosure.

FIG. 13A is a schematic vertical cross-sectional view of the second exemplary structure after formation of backside contact openings according to the second embodiment of the present disclosure.

FIG. 13B is a schematic horizontal cross-sectional view of the second exemplary structure of FIG. 13A with a juxtaposed hexagonal lattice structure according to the second embodiment of the present disclosure.

FIG. 14A is a schematic vertical cross-sectional view of the second exemplary structure after formation of backside recesses and dielectric material portions according to the second embodiment of the present disclosure.

FIG. 14B is a schematic horizontal cross-sectional view of the second exemplary structure of FIG. 14A with a juxtaposed hexagonal lattice structure according to the second embodiment of the present disclosure.

FIG. 17A is a schematic vertical cross-sectional view of the second exemplary structure after formation of a conformal dielectric material layer according to the second embodiment of the present disclosure.

FIG. 17B is a composite view in which a schematic horizontal cross-sectional view of the second exemplary structure of FIG. 17A along the plane B-B' is juxtaposed with a semi-transparent top-down view of the second exemplary structure of FIG. 17A according to the second embodiment of the present disclosure. A hexagonal lattice structure is juxtaposed to the composite view.

FIG. 18A is a schematic vertical cross-sectional view of the second exemplary structure after formation of a gapfill material layer and a photoresist layer according to the second embodiment of the present disclosure.

FIG. 18B is a composite view in which a schematic horizontal cross-sectional view of the second exemplary structure of FIG. 18A along the plane B-B' is juxtaposed with a semi-transparent top-down view of the second exemplary structure of FIG. 18A according to the second embodiment of the present disclosure. A hexagonal lattice structure is juxtaposed to the composite view.

FIG. 21A is a schematic vertical cross-sectional view of the second exemplary structure after removal of the dummy memory stack structures according to the second embodiment of the present disclosure.

FIG. 21B is a composite view in which a schematic horizontal cross-sectional view of the second exemplary structure of FIG. 21A along the plane B-B' is juxtaposed with a semi-transparent top-down view of the second exemplary structure of FIG. 21A according to the second embodiment of the present disclosure. A hexagonal lattice structure is juxtaposed to the composite view.

FIG. 22A is a schematic vertical cross-sectional view of the second exemplary structure after removal of the gapfill material layer according to the second embodiment of the present disclosure.

FIG. 22B is a schematic horizontal cross-sectional view of the second exemplary structure of FIG. 22A with a juxtaposed hexagonal lattice structure according to the second embodiment of the present disclosure.

FIG. 26C is a juxtaposition of the horizontal cross-sectional view of FIG. 26B with a wiring schematic for the various metal interconnect structures according to the second embodiment of the present disclosure.

DETAILED DESCRIPTION

Figures 4A, 4B:
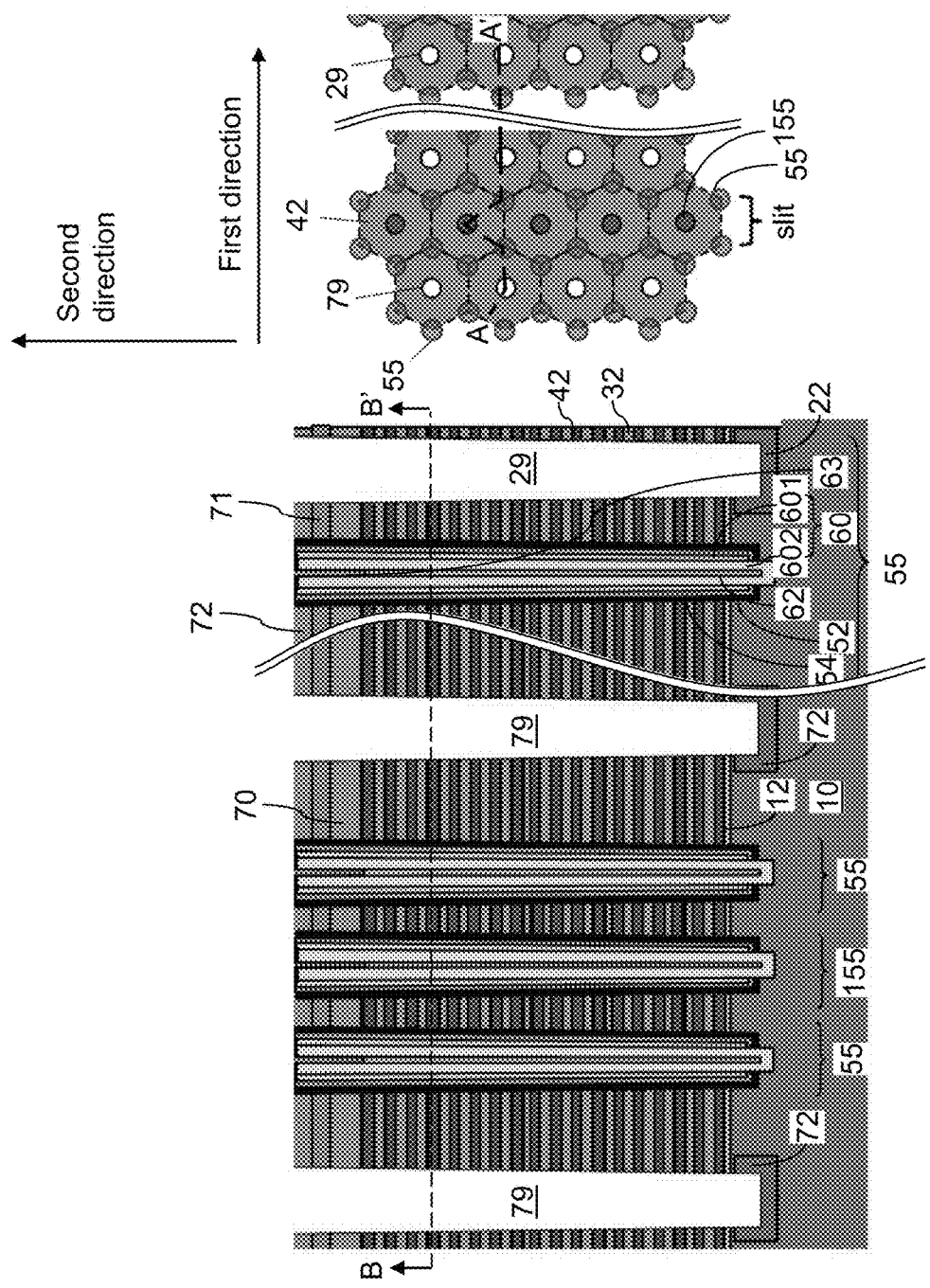
FIG. 4A is a schematic vertical cross-sectional view of the first exemplary structure after formation of first-type backside contact openings and second-type backside contact openings according to the first embodiment of the present disclosure.
FIG. 4B is a schematic horizontal cross-sectional view of the first exemplary structure of FIG. 4A with a juxtaposed hexagonal lattice structure according to the first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The exemplary structure includes a substrate, which can be a semiconductor substrate. The substrate can include a semiconductor material layer 10. The semiconductor material layer 10 can include at least one elemental semiconductor material, at least one III-V compound semiconductor material, at least one II-VI compound semiconductor material, at least one organic semiconductor material, or other semiconductor materials known in the art. The substrate can have a major surface, which can be, for example, a topmost surface of the substrate semiconductor layer. The major surface can be a semiconductor surface. In one embodiment, the major surface can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer.

At least one semiconductor device (not shown) for a peripheral circuitry can be formed on a portion of the substrate semiconductor layer. The at least one semiconductor device can include, for example, field effect transistors. Optionally, a dielectric pad layer 12 can be formed on, or above, the semiconductor material layer 10.

A stack of an alternating plurality of first material layers (which can be insulator layers 32) and second material layers (which can be sacrificial material layer 42) is formed over the top surface of the substrate, which can be, for example, on the top surface of the dielectric pad layer 12. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 comprise a dielectric material, i.e., an electrically insulating material. Portions of the second material of the sacrificial material layers 42 can be subsequently replaced with electrically conductive electrodes which can function, for example, as control gate electrodes of a vertical NAND device. A non-limiting example of the second material includes silicon nitride.

In one embodiment, the insulator layers 32 can include silicon oxide, and sacrificial material layers can include silicon nitride. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, by CVD.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (which corresponds to the number of control gate electrodes to be subsequently formed) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

At least one insulating cap layer (70, 71, 72) can be formed over the alternating stack (32, 42). Each of the at least one insulating cap layer (70, 71, 72) includes a dielectric material that is different from the material of the sacrificial material layers 42. In one embodiment, the at least one insulating cap layer (70, 71, 72) can include a dielectric material that can be employed for the insulator layers 32 as described above. The at least one insulating cap layer (70, 71, 72) can have a greater thickness than each of the insulator layers 32. The at least one insulating cap layer (70, 71, 72) can be deposited, for example, by chemical vapor deposition. In one embodiment, the at least one insulating cap layer (70, 71, 72) can be a silicon oxide layer.

Subsequently, a lithographic material stack (not shown) including at least a photoresist layer can be formed over the at least one insulating cap layer (70, 71, 72) and the alternating stack (32, 42), and can be lithographically patterned to form openings therein. The openings in the lithographic stack include first openings and second openings.

The first openings in the lithographic stack are arranged in a hexagonal array. Specifically, the first openings at vertices of hexagons of a hexagonal lattice. As used herein, a hexagonal lattice is a two-dimensional lattice structure in which hexagons of a same shape are repeated along three different directions. Each hexagon within the hexagonal lattice has a same hexagonal shape, which can be a regular hexagonal shape in which all sides of the hexagon have the same length, or can be a non-regular hexagonal shape in which not all sides of the hexagon have the same length. The angle between adjoining sides of each hexagon can be 60 degrees. Each hexagon of the hexagonal lattice has a pair of sides that are parallel to a first horizontal direction and perpendicular to a second horizontal direction.

The second openings in the lithographic stack are formed at locations corresponding to a respective center of a first subset of hexagons that are adjoined to one another and repeated along one direction. For example, the first subset of hexagons can form a first one-dimensional array that extends along the second horizontal direction. The second openings can be formed in every other row of hexagons extending along the second horizontal direction such that the first openings and the second openings alternate along the first horizontal direction.

The pattern in the lithographic material stack can be transferred through the at least one insulating cap layer (70, 71, 72) and through entirety of the alternating stack (32, 42) by at least one anisotropic etch that employs the patterned lithographic material stack as an etch mask. Portions of the at least one insulating cap layer (70, 71, 72) and the alternating stack (32, 42) underlying the first openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The portions of the alternating stack (32, 42) underlying the second openings in the patterned lithographic material stack are etched to form dummy memory openings 149.

The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric pad layer 12 may be used as an etch stop layer between the alternating stack (32, 42) and the substrate. The sidewalls of the memory openings 49 and the dummy memory openings 149 can be substantially vertical, or can be tapered. The patterned lithographic material stack can be subsequently removed, for example, by ashing.

The memory openings 49 and the dummy memory openings 149 are formed through the dielectric pad layer 12 so that the memory openings 49 and the dummy memory openings 149 extend from the top surface of the alternating stack (32, 42) to the top surface of the semiconductor material layer 10.

In one embodiment, an overetch into the semiconductor material layer 10 may be optionally performed after the top surface of the semiconductor material layer 10 is physically exposed at a bottom of each memory opening 49 and each dummy memory opening 149. The overetch may be performed prior to, or after, removal of the lithographic material stack. In other words, the recessed surfaces of the semiconductor material layer 10 may be vertically offset from the unrecessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 and each dummy memory opening 149 can be coplanar with the topmost surface of the semiconductor material layer 10. Each of the memory openings 49 and each of the dummy memory openings 149 can include a sidewall (or a plurality of sidewalls) that extends substantially perpendicular to the topmost surface of the substrate. The region in which the array of memory openings 49 is formed is herein referred to as a device region.

Referring to FIGS. 2A and 2B, a first memory stack structure 55 can be formed in each of the memory opening 49, and a second memory stack structure 155 (or a "dummy memory stack structure") can be formed in each of the dummy memory opening 149. Each memory stack structure (55, 155) can be formed, for example, by sequential deposition of a memory film (52, 54) and an optional first semiconductor channel portion 601, removal of horizontal portions of the optional first semiconductor material layer 601 and the memory film (52, 54) at the bottom of the corresponding memory opening 49 (or the corresponding dummy memory opening), and deposition of a second semiconductor material layer 602, an optional dielectric material portion 62, and a drain region 63.

Each memory film (52, 54) can include at least one blocking dielectric layer 52 and a memory material layer 54. The at least one blocking dielectric layer 52 can be deposited on the sidewalls of each memory opening 49 and each dummy memory opening 149 by a conformal deposition method. The at least one blocking dielectric layer 52 includes a dielectric material, which can be silicon oxide and/or a dielectric metal oxide.

The memory material layer 54 can include a stack of a charge storage layer and a tunneling dielectric layer. The charge storage layer can be formed as a single charge storage material layer of homogeneous composition, or can include a stack of multiple charge storage material layers. Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The tunneling dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof.

The optional first semiconductor channel portion 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel portion 601 includes amorphous silicon or polysilicon. The first semiconductor channel portion 601 can be formed by a conformal deposition method such as low pressure chemical vapor deposition (LPCVD). The thickness of the first semiconductor channel portion 601 can be in a range from 2 nm to 10 nm, although lesser and greater thicknesses can also be employed. A cavity may be present in each volume of the memory openings 49 and the dummy memory openings 149 that is not filled with the deposited material layers (52, 54, 601).

The optional first semiconductor channel portion 601, the memory material layer 54, the at least one blocking dielectric layer 52 are sequentially anisotropically etched employing at least one anisotropic etch process. Bottom portions of the first semiconductor channel portion 601, the memory material layer 54, and the at least one blocking dielectric layer 52 located above the top surface of the at least one insulating cap layer (70, 71, 72) can be removed by the at least one anisotropic etch process. Further, the horizontal portions of the first semiconductor channel portion 601, the memory material layer 54, and the at least one blocking dielectric layer 52 at a bottom of each memory opening 49 and each dummy memory opening 149 can be removed to form openings and to physically expose a surface of the semiconductor material layer 10 underneath each memory opening 49 and each dummy memory opening 149.

A second semiconductor channel portion 602 can be deposited directly on a respective semiconductor surface of the semiconductor material layer 10 and directly on a respective first semiconductor channel portion 601 within each memory opening 49 and each dummy memory opening 149. The second semiconductor channel portion 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel portion 602 includes amorphous silicon or polysilicon. The second semiconductor channel portion 602 can be formed by a conformal deposition method such as low pressure chemical vapor deposition (LPCVD).

The materials of the first semiconductor channel portion 601 and the second semiconductor channel portion 602 are collectively referred to as a semiconductor channel material. In other words, the semiconductor channel material is a set of all semiconductor material in the first semiconductor channel portion 601 and the second semiconductor channel portion 602. A first semiconductor channel portion 601 and a second semiconductor channel portion 602 within a same memory opening 49 or within a same dummy memory opening 149 collectively constitutes a vertical semiconductor channel 60.

A dielectric core 62 can be formed within each memory opening 49 and each dummy memory opening 149 by deposition and recess of a dielectric material, The dielectric cores 62 includes a dielectric material such as silicon oxide or organosilicate glass.

Drain regions 63 can be formed by depositing a doped semiconductor material within each recessed region located above a respective dielectric core 62. The doped semiconductor material can be, for example, doped polysilicon. Excess portions of the deposited semiconductor material can be removed from above the top surface of the at least one insulating cap layer (70, 71, 72), for example, by chemical mechanical planarization (CMP) or a recess etch to form the drain regions 63.

Referring to FIGS. 3A and 3B, a lithographic material stack (177, 178, 179) is applied over the at least one insulating cap layer (70, 71, 72) to form openings therethrough. In an illustrative example, the lithographic material stack (177, 178, 179) can include, from bottom to top, an amorphous carbon-based film 177 (such as Advanced Patterning Film™ by Applied Materials, Inc.™), a dielectric antireflective coating (DARC) layer 178, and a photoresist layer 179. Openings are formed in the lithographic material stack (177, 178, 179) by lithographic exposure and development. The openings include first-type openings and second-type openings.

The first-type openings 79" are formed within the lithographic material stack (177, 178, 179) at a respective center of a second subset of the hexagons that forms a second one-dimensional array that extends along a horizontal direction. The second one-dimensional array is different from the first one-dimensional array within which the second memory stack structures 155 (i.e., the dummy memory stack structures) are formed. In one embodiment, the second one-dimensional array can extend, and be periodic, along the second horizontal direction along which the first one-dimensional array extend.

Second-type openings 29" are formed within the lithographic material stack (177, 178, 179) at a respective center of a third subset of the hexagons that forms a third one-dimensional array that extends along a horizontal direction. The third one-dimensional array is different from the first one-dimensional array and from the second one-dimensional array. In one embodiment, the third one-dimensional array can extend, and be periodic, along the second horizontal direction along which the first one-dimensional array extend. In one embodiment, the third one-dimensional array can be located, for example, at a peripheral portion of the array region.

Figure 11A:
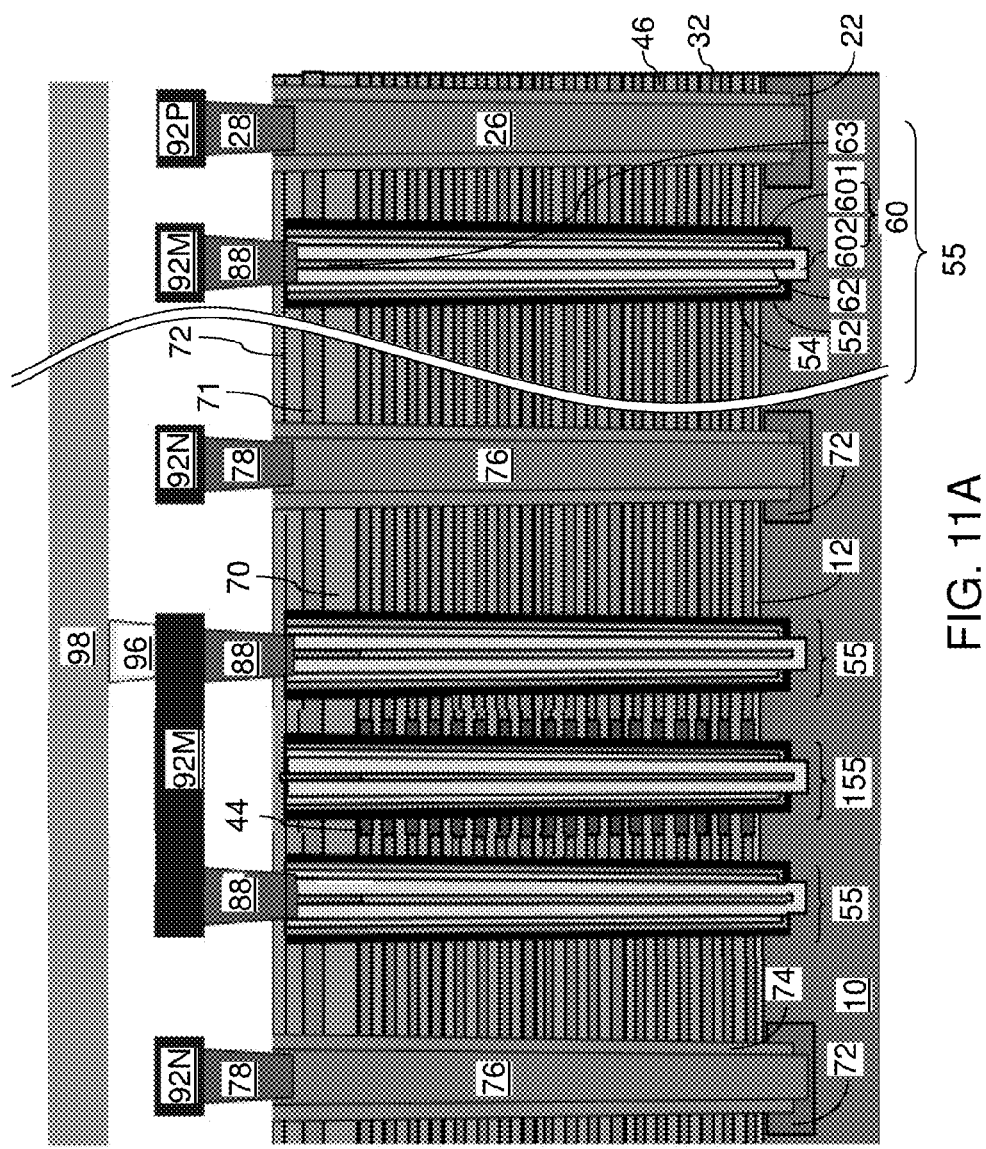
FIG. 11A is a schematic vertical cross-sectional view of the first exemplary structure after formation of various metal interconnect structures according to the first embodiment of the present disclosure.
Figure 11B:
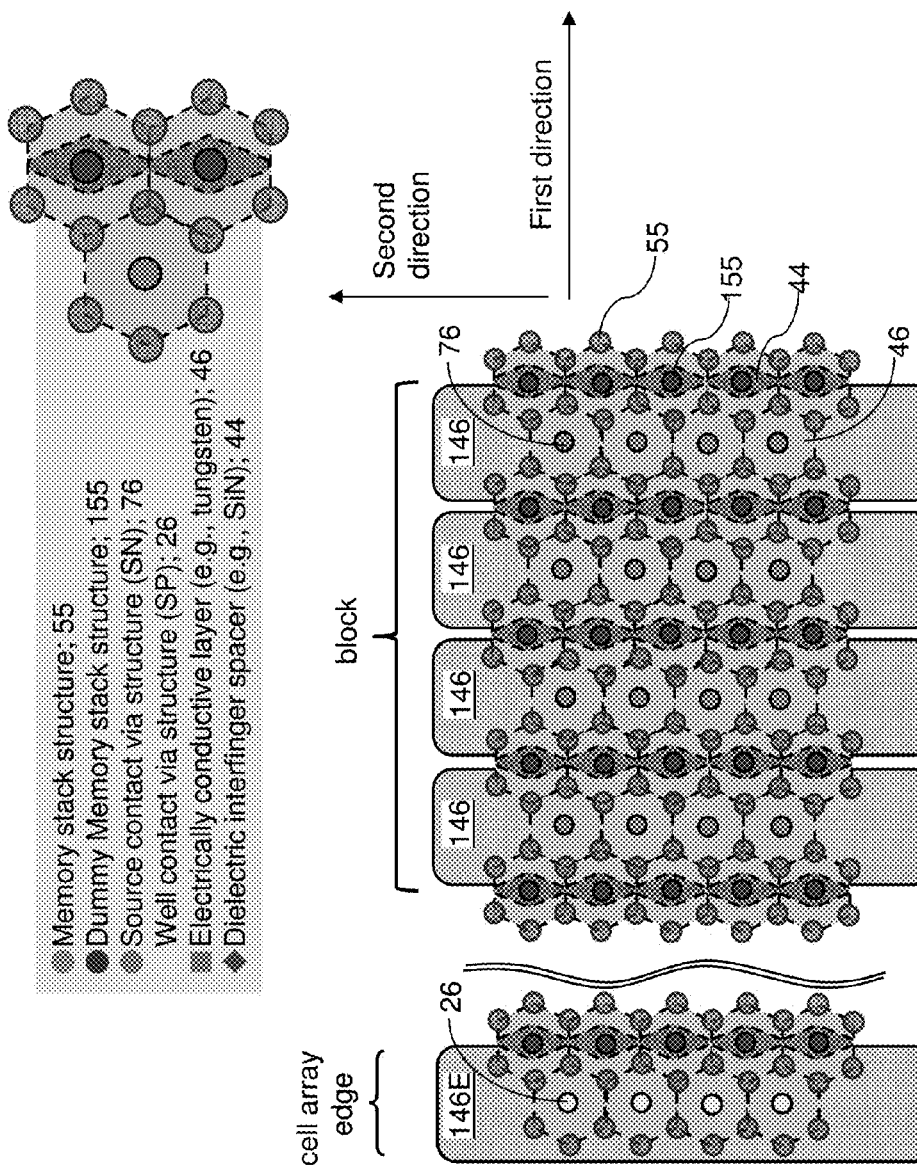
FIG. 11B is a schematic horizontal cross-sectional view of the first exemplary structure of FIG. 11A according to the first embodiment of the present disclosure.

Referring to FIGS. 4A and 4B, first-type backside contact openings 79 and second-type backside contact openings 29 are formed through the at least one insulating cap layer (70, 71, 72) and the alternating stack (32, 42). The second-type backside contact openings 29 are shown in FIG. 4A but are not shown in FIG. 4B for conciseness, since they are spaced apart from openings 79 and are located at the memory cell array edge region, as will be shown and described below with respect to FIGS. 11B and 11C. The first-type and second-type backside contact openings (79, 29) can have a substantially circular horizontal cross-sectional shape, an elliptical cross-sectional shape, or a hexagonal cross-sectional shape, although other horizontal cross-sectional shapes can also be employed. Portions of the at least one insulating cap layer (70, 71, 72) and the alternating stack (32, 42) underlying the first-type openings 79" are etched to form first-type backside contact openings 79. Portions of the at least one insulating cap layer (70, 71, 72) and the alternating stack (32, 42) underlying the second-type openings 29" are etched to form second-type backside contact openings 29.

In one embodiment, first-type backside contact openings 79 can be source contact openings in which source contact via structures are subsequently formed. In one embodiment, the second-type backside contact openings 29 can be, well contact openings in which well contact via structures are subsequently formed. In one embodiment, the second-type backside contact openings can be formed in regions in which a doped well (such as a p-type well) is present within the substrate semiconductor layer 10. In one embodiment, the plurality of source contact openings can be formed at a respective center of the second subset of the hexagons that forms the second one-dimensional array that extends along the second horizontal direction. In one embodiment, the plurality of well contact openings can be formed at a respective center of the third subset of hexagons that forms the third one-dimensional array that extends along the second horizontal direction.

The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric pad layer 12 may be used as an etch stop layer between the alternating stack (32, 42) and the substrate. The sidewalls of the first-type backside contact openings 79 and the second-type backside contact openings 29 can be substantially vertical, or can be tapered. The patterned lithographic material stack (177, 178, 179) can be subsequently removed, for example, by ashing.

The first-type backside contact openings 79 and the second-type backside contact openings 29 are formed through the dielectric pad layer 12 so that the first-type backside contact openings 79 and the second-type backside contact openings 29 extend from the top surface of the alternating stack (32, 42) to the top surface of the semiconductor material layer 10.

A masked ion implantation process can be employed to implant electrical dopants of a first conductivity type into portions of the semiconductor material layer 10 that underlie the first-type backside contact openings 79 to form source regions 72. The source regions 72 can have a same type of doping as the drain regions 63. The source regions 72 and the drain regions 63 can have a doping of the opposite conductivity type of the doping of the semiconductor channels 60.

Another masked ion implantation process can be employed to implant electrical dopants of the second conductivity type into portions of the semiconductor material layer 10 that underlie the second-type backside contact openings 29 to form well contact regions 22. The well contact regions 22 can have the same conductivity type as the semiconductor material layer 10, of which can be employed as a channel portion of the memory stack structures 55. The well contact regions 22 can have a doping of the same conductivity type as the semiconductor channels 60. The well contact regions 22 can be employed to electrically bias selected portions of the semiconductor material layer 10.

Figures 5A, 5B:
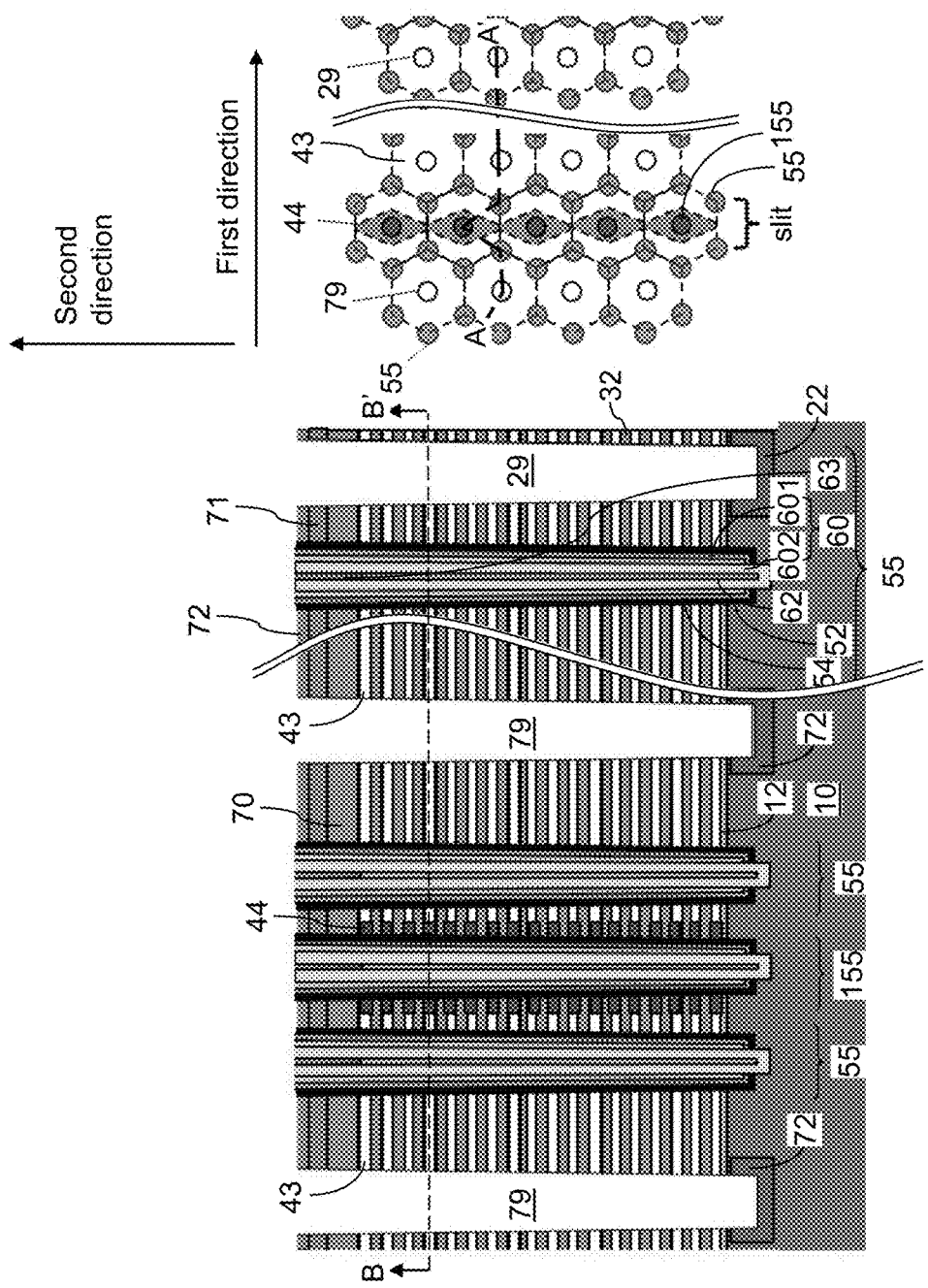
FIG. 5A is a schematic vertical cross-sectional view of the first exemplary structure after formation of backside recesses and dielectric material portions according to the first embodiment of the present disclosure.
FIG. 5B is a schematic horizontal cross-sectional view of the first exemplary structure of FIG. 5A with a juxtaposed hexagonal lattice structure according to the first embodiment of the present disclosure.

Referring to FIGS. 5A and 5B, an etchant that selectively etches the second material of the sacrificial material layers 42 with respect to the first material of the insulator layers 32 can be introduced into the first-type and second-type backside contact openings (79, 29), for example, employing an etch process. Backside recesses 43 are formed in volumes from which the sacrificial material layers 42 are removed. The removal of the second material of the sacrificial material layers 42 can be selective to the first material of the insulator layers 32, the semiconductor material of the semiconductor material layer 10, and the material of the outermost layer of the memory films (52, 54). In one embodiment, the sacrificial material layers 42 can include silicon nitride, and the materials of the insulator layers 32 can be selected from silicon oxide and dielectric metal oxides The etch process that removes the second material selective to the first material and the outermost layer of the memory films (52, 54) can be a wet etch process employing a wet etch solution, or can be a gas phase (dry) etch process in which the etchant is introduced in a vapor phase into the first-type and second-type contact openings (79, 29). For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art.

The duration of the etch process is selected such that the portions of the second material layers 42 laterally surrounding the second memory stack structures 155 (i.e., the dummy memory stack structures) are not removed at the end of the etch process. A dielectric material portion 44 laterally surrounding the dummy memory openings (in which the second memory stack structures 155 are present) is formed by a contiguous remaining portion of each second material layer 42. A vertically spaced stack of the dielectric material portions 44 located at each level between a neighboring pair of insulator layers 32 is formed within the first exemplary structure. In one embodiment, each dielectric material portion 44 can have an undulating width along the second horizontal direction, i.e., the horizontal direction along which the one-dimensional array of a set of second memory stack structures 155 (that are present within a corresponding set of dummy memory openings). Each dielectric material portion 44 can have the same number of holes as the total number of second memory stack structures 155 that the dielectric material portion 44 laterally enclose.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings and the dummy memory openings in which the first memory stack structures 55 and the second memory stack structures 155 are formed are herein referred to as front side recesses or front side cavities in contrast with the backside recesses 43. In one embodiment, the first memory stack structures can an array of monolithic three-dimensional NAND strings having a plurality of device levels disposed above the substrate. In this case, each backside recess 43 can define a space for receiving a respective word line of the array of monolithic three-dimensional NAND strings.

Each of the plurality of backside recesses 43 can extend substantially parallel to the top surface of the substrate. A backside recess 43 can be vertically bounded by a top surface of an underlying insulator layer 32 and a bottom surface of an overlying insulator layer 32. In one embodiment, each backside recess 43 can have a uniform height throughout. Each dielectric material portion 44 can contact an outer sidewall of a second memory stack structure 155

(i.e., a dummy memory stack structure), a bottom surface of an overlying dielectric material layer (such as an insulator layer 32 or at least one insulating cap layer (70, 71, 72)), and a top surface of an underlying dielectric material layer (such as another insulator layer 32 or the dielectric pad layer 12). Outer surfaces of the memory stack structures 55 are physically exposed to the backside recesses 43.

Figures 6A, 6B:
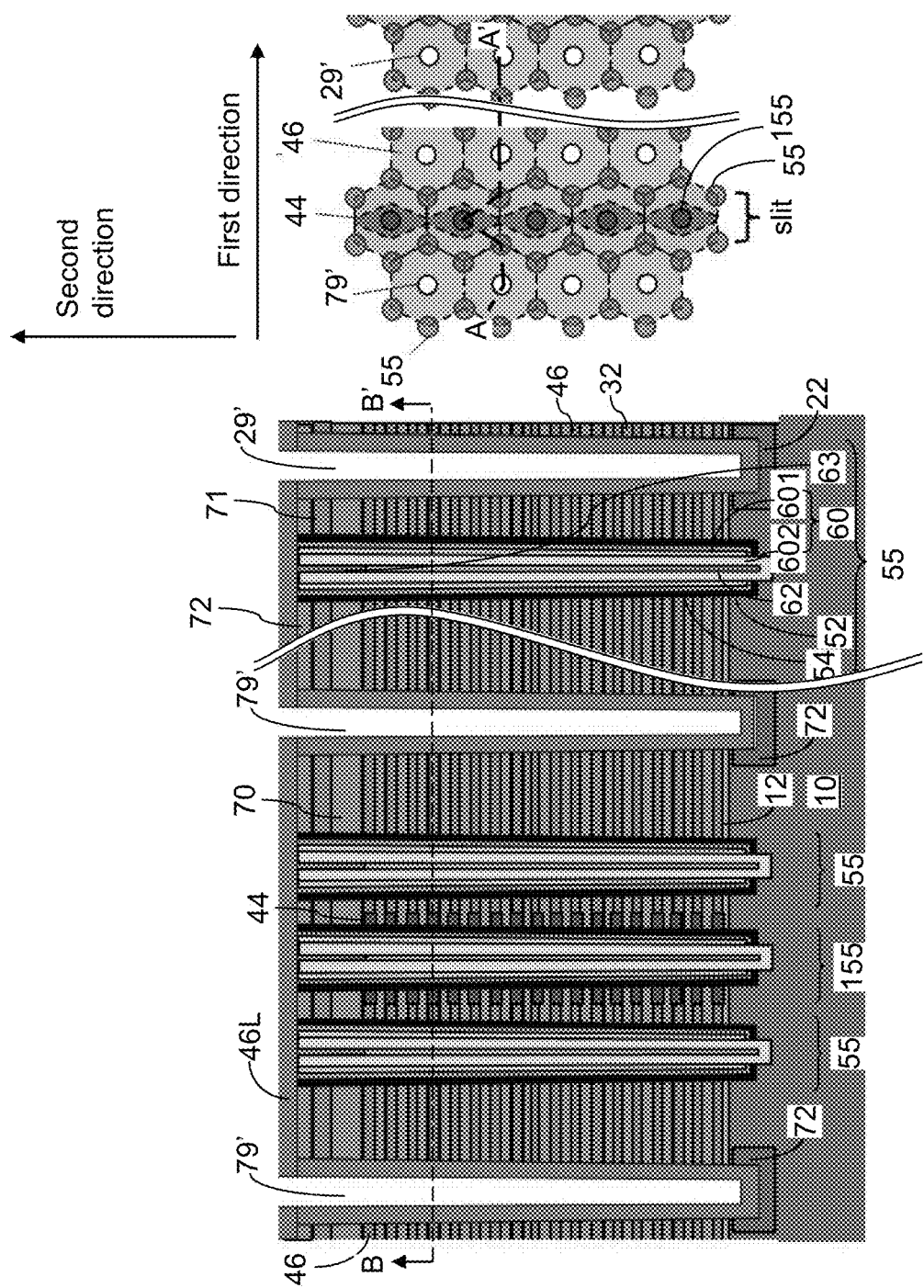
FIG. 6A is a schematic vertical cross-sectional view of the first exemplary structure after formation of electrically conductive layers and a contiguous conductive material layer according to the first embodiment of the present disclosure.
FIG. 6B is a schematic horizontal cross-sectional view of the first exemplary structure of FIG. 6A with a juxtaposed hexagonal lattice structure according to the first embodiment of the present disclosure.

Referring to FIGS. 6A and 6B, an additional blocking dielectric layer (not shown) can be optionally deposited on the outer sidewalls of the memory stack structures 55 and on physically exposed surfaces of the insulator layers 32, for example, by a conformal deposition method. The thickness of the additional blocking dielectric layer (if present) is selected such that an unfilled portion of the backside recesses 43 is present at each level of the dielectric material portions 44. The additional blocking dielectric layer can comprise a dielectric metal oxide (such as aluminum oxide), and can be formed, for example, by an atomic layer deposition (ALD) process.

At least one conductive material can be deposited in the plurality of backside recesses 43, on sidewalls of the first-type and second-type backside contact openings (79, 29), and over the top surface of the at least one insulating cap layer (70, 71, 72). The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the at least one conductive material can be deposited directly on horizontal surfaces of the insulator layers 32 and on the outer sidewalls of the memory stack structures 55 and on the contiguous outer sidewall of each dielectric material portion 44.

In one embodiment, the at least one conductive material can comprise a metal such as tungsten and/or metal nitride. In one embodiment, the at least one conductive material for filling the plurality of backside recesses 43 can be selected from tungsten and a combination of titanium nitride and tungsten. In one embodiment, the at least one conductive material can be deposited by chemical vapor deposition. In one embodiment, the at least one conductive can include a first conductive material comprising a conductive metallic nitride and a second conductive material comprising an elemental metal or an alloy of at least two elemental metals. In this case, the deposited conductive material layers can include a metallic liner comprising the first conductive material and a metallic fill material layer comprising the second conductive material. In one embodiment, the metallic liner can include titanium nitride, and the metallic fill material layer can comprise tungsten.

Each portion of the at least one conductive material that fills a backside recess 43 constitutes an electrically conductive layer 46. A plurality of electrically conductive layers 46 can be formed in the plurality of backside recesses 43, and a contiguous conductive material layer 46L can be formed on the sidewalls of the first-type and second-type backside contact openings (79, 29) and over the at least one insulating cap layer (70, 71, 72). Thus, less than the entirety of each sacrificial material layer 42 is replaced with an electrically conductive layer 46, and each remaining portion of the sacrificial material layer 42 constitutes a dielectric material portion 44 that contacts sidewalls of a plurality of second memory stack structures 155 (i.e., dummy memory stack structures). Each electrically conductive layer 46 is formed within a backside recess 43 and over sidewalls of one or more dielectric material portions 44. A first-type cavity 79' is present within each first-type backside contact opening 79, and a second-type cavity 29' is present within each second-type backside contact opening 29.

Figures 7A, 7B:
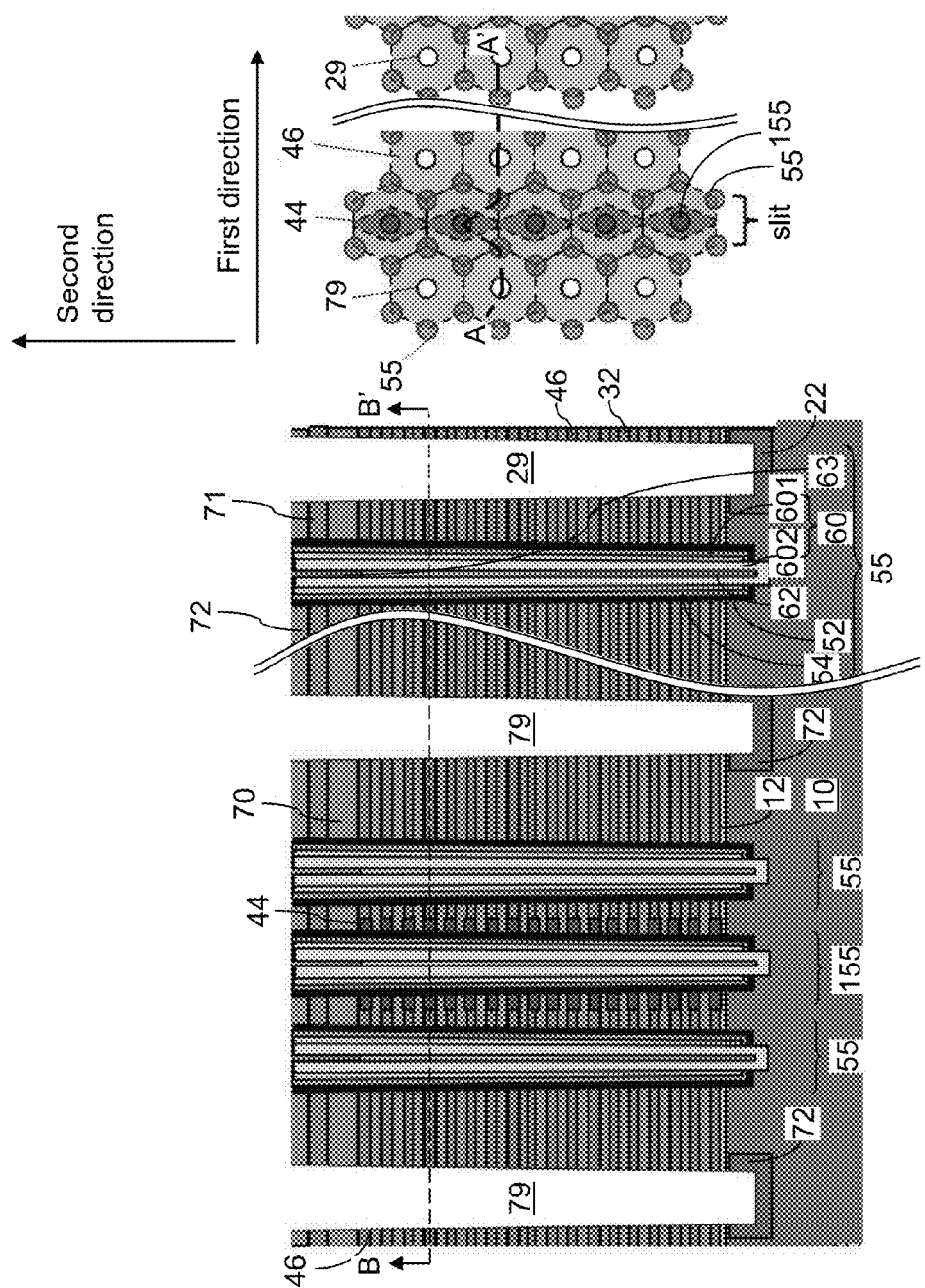
FIG. 7A is a schematic vertical cross-sectional view of the first exemplary structure after removal of the contiguous conductive material layer according to the first embodiment of the present disclosure.
FIG. 7B is a schematic horizontal cross-sectional view of the first exemplary structure of FIG. 7A with a juxtaposed hexagonal lattice structure according to the first embodiment of the present disclosure.

Referring to FIGS. 7A and 7B, the contiguous conductive material layer 46L can be removed. Specifically, the deposited conductive material of the contiguous conductive material layer 46L can be etched back from the sidewalls of each first-type backside contact opening 79, from the sidewalls of each second-type backside contact opening 29, and from above the at least one insulating cap layer (70, 71, 72), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Figures 8A, 8B:
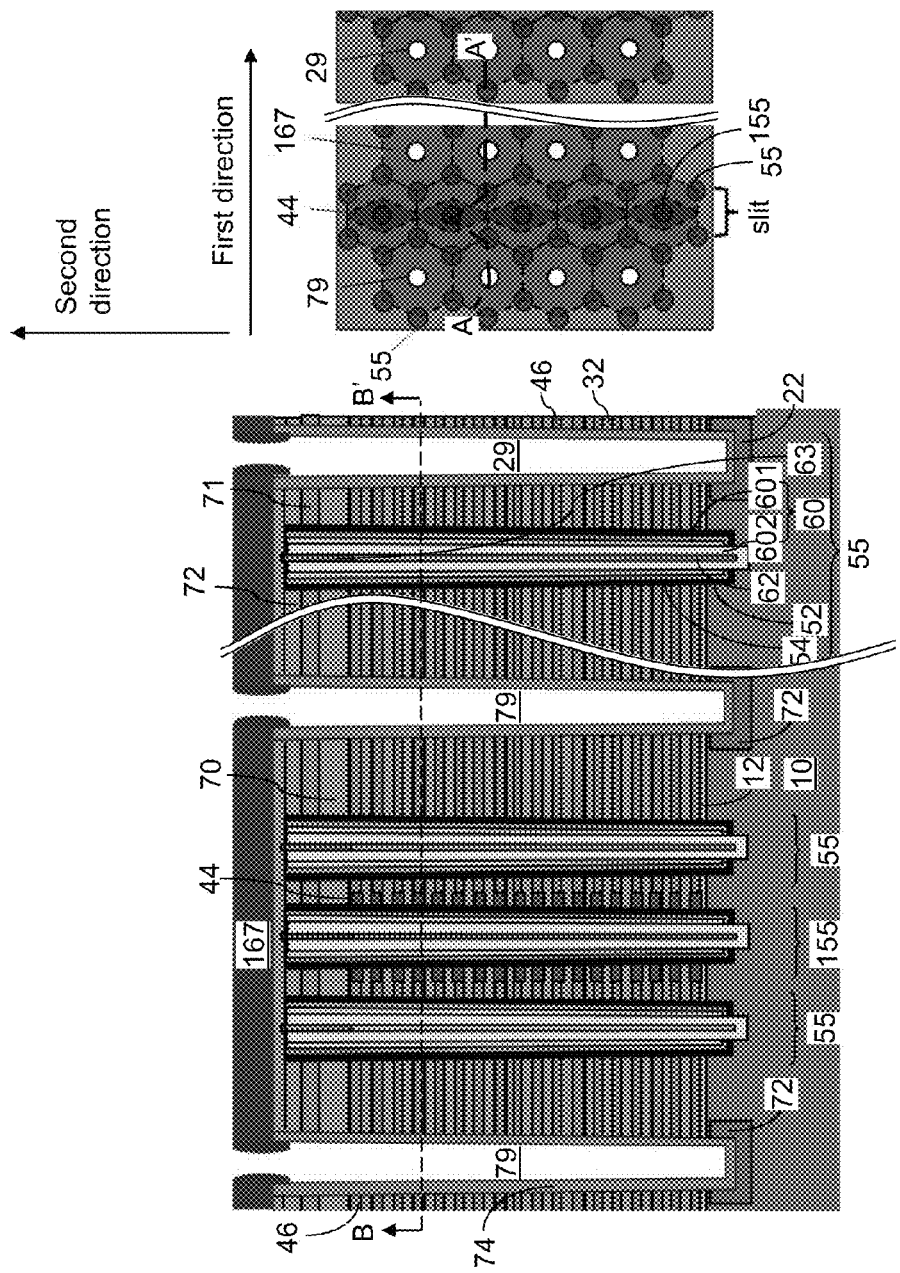
FIG. 8A is a schematic vertical cross-sectional view of the first exemplary structure after formation of a conformal dielectric material layer and a non-conformal hard mask layer according to the first embodiment of the present disclosure.
FIG. 8B is a composite view in which a schematic horizontal cross-sectional view of the first exemplary structure of FIG. 8A along the plane B-B' is juxtaposed with a semi-transparent top-down view of the first exemplary structure of FIG. 8A according to the first embodiment of the present disclosure. A hexagonal lattice structure is juxtaposed to the composite view.

Referring to FIGS. 8A and 8B, a conformal dielectric material layer 74 can be formed on the sidewalls of the first-type and second-type backside contact openings (79, 29) and over the at least one insulating cap layer (70, 71, 72). The conformal dielectric material layer 74 includes a dielectric material such as doped silicate glass or undoped silicate glass.

Subsequently, a non-conformal hard mask layer 167 can be deposited over the at least one insulating cap layer (70, 71, 72). The non-conformal hard mask layer 167 is deposited employing a non-conformal deposition process such as plasma-enhanced chemical vapor deposition (PECVD). In one embodiment, the non-conformal hard mask layer 167 can be an amorphous carbon-based film (such as Advanced Patterning Film™ by Applied Materials, Inc.™). Due to the non-conformal nature of the deposition process, the non-conformal hard mask layer 167 has a greater thickness over the at least one insulating cap layer (70, 71, 72) than at the bottom surfaces of the backside contact openings (79, 29).

Referring to FIGS. 9A and 9B, an anisotropic etch can be performed to etch the portions of the conformal dielectric material layer 74 that underlies the backside contact openings (79, 29). Surfaces of the source regions 72 and the well contact regions 22 can be physically exposed at the bottom of the first-type backside contact openings 79 and the second-type backside contact openings 29. In one embodiment, portions of the source regions 72 and the well contact regions 22 can be vertically recessed such that sidewall surfaces of the source regions 72 and the well contact regions 22 are physically exposed at the bottom of the first-type backside contact openings 79 and the second-type backside contact openings 29, respectively. Subsequently, the non-conformal hard mask layer 167 can be removed, for example, by ashing.

The remaining portions of the conformal dielectric material layer 74 is a single contiguous layer including vertically extending portions into the first-type backside contact openings 79 and the second-type backside contact openings 29 and a horizontal portion adjoined to each vertical portion. Each vertically extending portion of the conformal dielectric material layer 74 constitutes an insulating spacer that laterally separates the alternating stack (32, 46) of the insulator layers 32 and the electrically conductive layers 46 from contact via structures to be subsequently formed inside the first-type backside contact openings 79 and the second-type backside contact openings 29. The conformal dielectric material layer 74 is not shown in FIG. 9B for clarity.

Figures 10A, 10B:
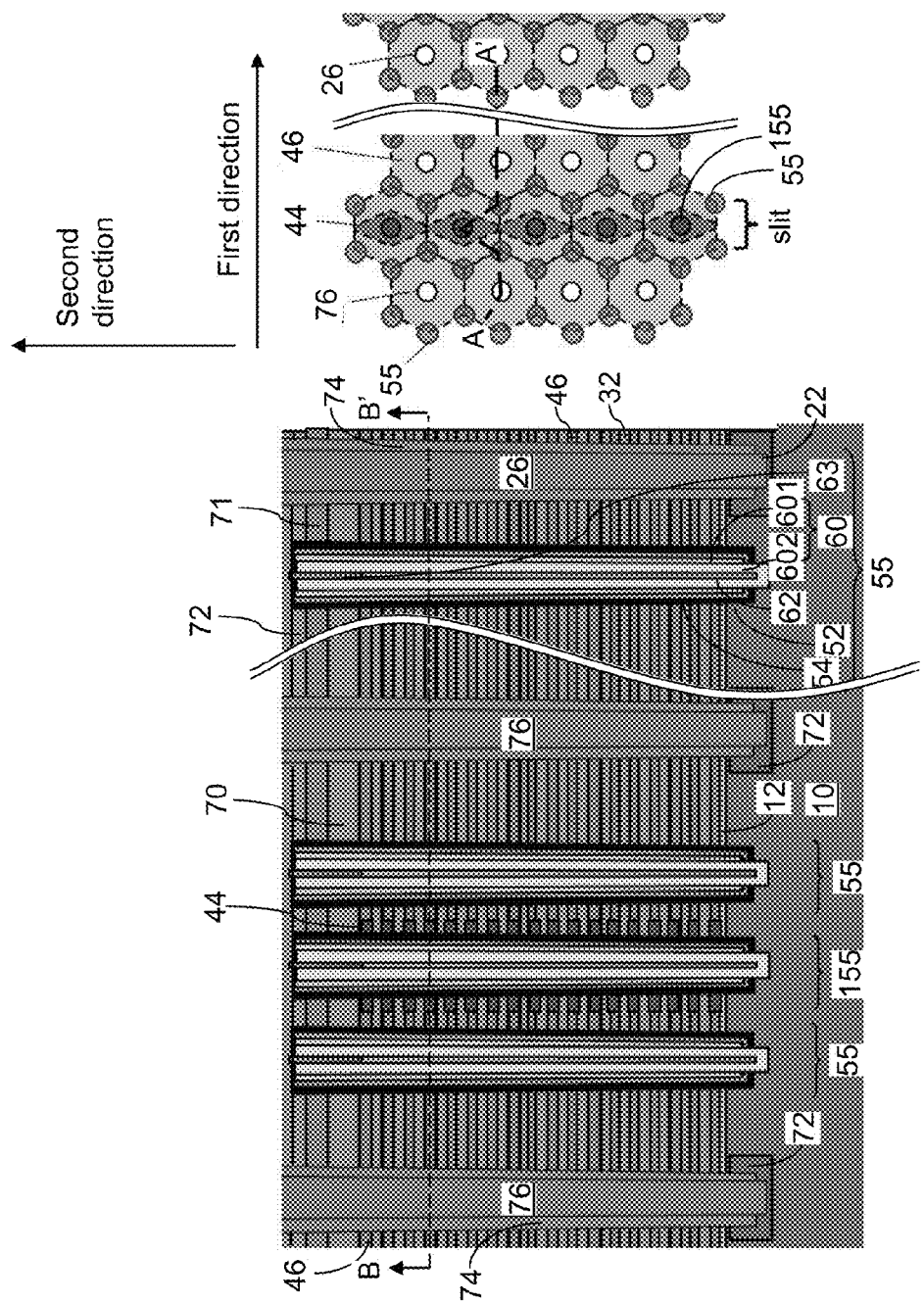
FIG. 10A is a schematic vertical cross-sectional view of the first exemplary structure after formation of first-type contact via structures and second-type contact via structures according to the first embodiment of the present disclosure.
FIG. 10B is a schematic horizontal cross-sectional view of the first exemplary structure of FIG. 10A with a juxtaposed hexagonal lattice structure according to the first embodiment of the present disclosure.

Referring to FIGS. 10A and 10B, each cavity laterally surrounded by insulating spacers (i.e., the vertically extending portions of the conformal dielectric material layer 74) can be simultaneously filled with a conductive material to form contact via structures (76, 26). For example, a source contact via structure 76 can be formed within each cavity derived from a first-type contact via trench 79 (which can be a source contact opening), and a well contact via structure 26 can be formed within each cavity derived from a second-type contact via trench 29 (which can be a well contact opening). Excess portions of the deposited conductive material can be removed from above the horizontal portion of the conformal dielectric material layer 74, for example, by chemical mechanical planarization and/or a recess etch.

Referring to FIGS. 11A-11D, metal interconnect structures (88, 78, 28, 92M, 92N, 92P, 96, 98) and dielectric material layers (not shown) can be formed over the at least one insulating cap layer (70, 71, 72) to provide electrical connection to the drain regions 63 within the memory stack structures 55, to the source contact via structures 76, and to the well contact via structures 26.

For example, a first via level dielectric layer (not shown) and various first level contact via structures (88, 78, 28) can be formed, which include drain contact via structures 88 that contact drain regions 63, source interconnect via structures 78 that contact source contact via structures 76, and well interconnect via structures 28 that contact well contact via structures 26. A first line level dielectric layer (not shown) and first level line structures (92M, 92N, 92P) can be subsequently formed. The first level line structures (92M, 92N, 92P) include memory stack interconnect line structures 92M that contact drain contact via structures 88, source line structures 92N that contacts the source interconnect via structures 78, and well bias line structures 92P that contacts the well interconnect via structures 26. The memory stack interconnect structures 92M can provide local interconnection among drain regions 63 located at vertices of a same hexagon within the hexagonal lattice as illustrated in FIGS. 11C and 11D.

A second via level dielectric layer (not shown) and various second level contact via structures 96 can be formed. A first subset of the second level contact via structures 96 can be employed to provide vertical electrical connection to the memory stack interconnect line structures 92M. A second subset of the second level contact via structures 96 can be employed to provide vertical electrical connection to the source line structures 92N. A third subset of the second level contact via structures 96 can be employed to provide vertical electrical connection to the well bias line structures 92P. A second line level dielectric layer and second level line structures 98 (including bit lines) can be formed to provide further electrical connection.

Each finger (146. 146E) of an electrically conductive layer 46 can be laterally disjoined from a neighboring finger of the electrically conductive layer 46 located at the same level by a dielectric material portion 44, which extends along the second horizontal direction and laterally surrounds a one dimensional array of second memory stack structures 155, which are dummy memory stack structures that are not contacted by any metal interconnect structure. Thus, upon formation of metal interconnect structures (88, 78, 28, 92M, 92N, 92P, 96, 98) over the first memory stack structures 55 and the second memory stack structures 155, each drain region 63 of the first memory stack structures 55 in the memory openings contacts a respective drain contact via structure 88, and each second memory stack structure 155 located in the dummy memory openings does not contact any of the metal interconnect structures (88, 78, 28, 92M, 92N, 92P, 96, 98). Thus, the drain regions 63 of the second memory stack structures 155 do not contact any of the metal interconnect structures (88, 78, 28, 92M, 92N, 92P, 96, 98).

The first exemplary structure comprises a monolithic three-dimensional memory device. The monolithic three-dimensional memory device can comprise a stack (32, 46) of an alternating plurality of insulator layers 32 and electrically conductive layers 46 located over a substrate; a plurality of memory stack structures 55 located at vertices of hexagons of a hexagonal lattice and over the substrate; and a plurality of dummy memory stack structures 155 located at each center of a first subset of the hexagons. Each of the memory stack structure 55 and the dummy memory stack structures 155 comprises a memory film (52, 54) and a vertical semiconductor channel 60. The electrically conductive layers 46 contact outer sidewalls of the plurality of memory stack structures 55. Outer sidewalls of the plurality of dummy memory stack structures 155 are laterally spaced from the electrically conductive layers 46 by a vertically spaced stack of dielectric material portions 44.

In one embodiment, each vertical semiconductor channel 60 of the memory stack structures 55 can be physically and/or electrically contacted by a respective overlying contact via structure (such as a drain contact via structure 88). Each dummy memory stack structure 155 does not contact a conductive material portion above a horizontal plane including a bottommost surface of the alternating plurality of insulator layers 32 and electrically conductive layers 46.

In one embodiment, each hexagon of the hexagonal lattice has a pair of sides that are parallel to a first horizontal direction and perpendicular to a second horizontal direction. The first subset of the hexagons can constitute a first one-dimensional array extending along the second horizontal direction. In one embodiment, each dielectric material portion 44 of the vertically spaced stack laterally extends through multiple hexagons of the first subset along the second horizontal direction.

In one embodiment, each electrically conductive layer 46 comprises: a first electrically conductive portion contacting, and located on one side of, a respective dielectric material portion of the vertically spaced stack of the dielectric material portions 44; and a second electrically conductive portion contacting, and located on an opposite side of, the respective dielectric material portion of the vertically spaced stack of the dielectric material portions 44. The first electrically conductive portion and the second electrically conductive portion are electrically isolated from each other. In other words, the vertically spaced stack of the dielectric material portions 44 laterally separates physically, and electrically isolates, two disjoined parts (e.g., two neighboring fingers 146) of each electrically conductive layer 46.

In one embodiment, each dielectric material portion 44 of the vertically spaced stack can contact each outer sidewall of the plurality of dummy memory stack structures 155. In one embodiment, source contact via structures 76 can be located at each center of hexagons in a second subset of hexagons, which forms a second one-dimensional array that extends along the second horizontal direction. Each source contact via structure 76 can be electrically shorted to a respective source region 72 located over, or within, the substrate. Each source region 72 can contact a horizontal semiconductor channel within the substrate, which is a surface portion of the semiconductor material layer 10.

In one embodiment, well contact via structures 26 located at each center of a third subset of hexagons that forms a third one-dimensional array that extends along the second horizontal direction. Each well contact via structure 26 can be electrically shorted to a doped well (located within the semiconductor material layer 10) having a doping of an opposite conductivity type than the source regions 72. In one embodiment, drain contact via structures 88 (which are drain electrodes) can contact a respective drain region 63 within the memory stack structures 55. Source interconnect via structures 78 can contact a respective source contact via structure 76. Each top surface of the drain contact via structures 88 and source interconnect via structures 78 can contacts a bottom surface of a respective interconnect line structure (92M, 92N) located within a same horizontal plane.

In one embodiment, each of the source contact via structures 76 and the well contact via structures 26 can be laterally surrounded by an insulating spacer (i.e., a vertical portion of the conformal dielectric material layer 74) that contacts the electrically conductive layers 46 and the insulating layers 32. Drain contact via structures 88 can contact a respective drain region 63 within the memory stack structures 55. Well interconnect via structures 28 can contact a respective well contact via structure 26. Each top surface of the drain contact via structures 88 and well interconnect via structures 28 can contact a bottom surface of a respective interconnect line structure (92M, 92P) located within a same horizontal plane.

In one embodiment, each pair of a well contact structure 26 and a source contact structure 76 can be laterally spaced from each other by at least one vertical stack of dielectric material portions 44. In one embodiment, each of the source contact via structures 76 is laterally surrounded by an insulating spacer (i.e., a vertical portion of the conformal dielectric material layer 74) that contacts the electrically conductive layers 46 and the insulating layers 32. Each of the well contact via structures 26 is laterally surrounded by a second vertically spaced stack of dielectric material portions 44.

The monolithic three-dimensional memory device can comprise a plurality of memory stack structures 55 arranged in a hexagonal lattice and located over a substrate. The hexagonal lattice structure is defined by hexagons each having a pair of sides that are parallel to a first horizontal direction and perpendicular to a second horizontal direction. The memory stack structures 55 are located at vertices of the hexagonal lattice. Each first memory stack structure 55 comprises vertically spaced memory elements (located within a memory film (50, 52)) and a vertical semiconductor channel 60. Source contact via structures 76 are located at each center of a second subset of the hexagons that forms a one-dimensional array that extends along the second horizontal direction. Each source contact via structure 76 is electrically shorted to a respective source region 72 that is located over, or within, the substrate.

An alternating stack of insulator layers 32 and electrically conductive layers 46 and is located over the substrate. The plurality of memory stack structures 55 extends through the alternating stack (32, 46). A plurality of dummy memory stack structures 155 is located at each center of a first subset of the hexagons. Each of the memory stack structure 55 and the dummy memory stack structures 155 comprises a memory film (52, 54) and a vertical semiconductor channel 60. Some of the dummy memory stack structure 155 can be located between a pair of neighboring fingers 146 of the electrically conductive layers 46. The source contact via structures 76 can be embedded within a finger 146 of the electrically conductive layers 46, and can be located along the second horizontal direction, which is the direction along which the fingers 146 extend. Some of the vertical stacks of dielectric material portions 44 can function as an insulating separator between neighboring pairs of fingers 146 of the electrically conductive layers 46.

In one embodiment, the electrically conductive layers 46 contact outer sidewalls of the plurality of memory stack structures 55. Outer sidewalls of the plurality of dummy memory stack structures 155 are laterally spaced from the electrically conductive layers 46 by a vertically spaced stack of dielectric material portions 44.

Each source region 72 contacts a semiconductor channel that incorporates at least one respective vertical semiconductor channel 60. In one embodiment, each vertical semiconductor channel 60 of the memory stack structures 55 is physically and/or electrically contacted by a respective overlying contact via structure, i.e., a drain contact via structure 88. Each dummy memory stack structure 155 does not contact a conductive material portion above a horizontal plane including a bottommost surface of the alternating stack (32, 46).

Each first subset of the hexagons containing dummy memory stack structures 155 located along a line extending along the second direction constitutes a first one-dimensional array extending along the second horizontal direction. Each second subset of the hexagons containing source contact via structures 76 located along a line extending along the second direction constitutes a second one-dimensional array extending along the second horizontal direction.

Well contact via structures 26 can be located at each center of each third subset of hexagons that forms a third one-dimensional array that extends along the second horizontal direction. Each well contact via structure 26 can be electrically shorted via a well contact region 22 to a doped well having a doping of an opposite conductivity type than the source regions 72. Each third subset of the hexagons containing well contact via structures 26 located along a line extending along the second direction constitutes a third one-dimensional array extending along the second horizontal direction. In one embodiment, a third subset of hexagons can be located within an isolated finger 146E of the electrically conductive layers 46 at a peripheral region of the array device, while the first and second subsets of hexagons can be interlaced in an alternating sequence along the first horizontal direction, which is perpendicular to the second horizontal direction.

In one embodiment, the monolithic three-dimensional memory device comprises a vertical NAND memory device. The electrically conductive layers 46 can comprise, or can be electrically connected to, a respective word line of the NAND memory device. In one embodiment, the substrate comprises a silicon substrate, the NAND memory device comprises an array of monolithic three-dimensional NAND strings over the silicon substrate, and at least one memory cell in the first device level of the three-dimensional array of NAND strings is located over another memory cell in the second device level of the three-dimensional array of NAND strings. The silicon substrate can contain an integrated circuit comprising a driver circuit for the memory device located thereon. Each NAND string can comprises a plurality of semiconductor channels, wherein at least one end portion of each of the plurality of semiconductor channels extends substantially perpendicular to a top surface of the semiconductor substrate; a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

Referring to FIGS. 12A and 12B, a second exemplary structure according to a second embodiment of the present disclosure can be derived from the first exemplary structure of FIGS. 2A and 2B by forming a patterned lithographic material stack (177, 178, 179) with a different pattern. In the second embodiment, the well contact via structures 26 can be formed at portions of outermost fingers 146 within a same block (which is a physically proximate group of fingers 146). An unpatterned lithographic material stack (177, 178, 179) can be formed over the at least one insulating cap layer (70, 71, 72) in the same manner as in the processing steps of FIGS. 3A and 3B. The lithographic material stack (177, 178, 179) is patterned to form openings therethrough with a pattern that is different from the pattern employed in the first embodiment.

In the second embodiment, only the first-type openings 79" are formed within the lithographic material stack (177, 178, 179) at a respective center of a second subset of the hexagons that forms a second one-dimensional array that extends along a horizontal direction. The second one-dimensional array is different from the first one-dimensional array within which the second memory stack structures 155 (i.e., the dummy memory stack structures) are formed. In one embodiment, the second one-dimensional array can extend, and be periodic, along the second horizontal direction along which the first one-dimensional array extend. Openings are not formed at locations corresponding to the second-type openings 29" of the first embodiment.

Referring to FIGS. 13A and 13B, first-type backside contact openings 79 are formed through the at least one insulating cap layer (70, 71, 72) and the alternating stack (32, 42). The same processing steps can be employed as the processing steps of FIGS. 4A and 4B of the first embodiment. Portions of the at least one insulating cap layer (70, 71, 72) and the alternating stack (32, 42) underlying the first-type openings 79" are etched to form first-type backside contact openings 79. In one embodiment, first-type backside contact openings 79 can be source contact openings in which source contact via structures are subsequently formed. In one embodiment, the plurality of source contact openings can be formed at a respective center of the second subset of the hexagons that forms the second one-dimensional array that extends along the second horizontal direction. The same etch chemistry can be employed for the anisotropic etch process as in the first embodiment. The first-type backside contact openings 79 are formed through the dielectric pad layer 12 so that the first-type backside contact openings 79 extend from the top surface of the alternating stack (32, 42) to the top surface of the semiconductor material layer 10. Separate well contact openings 29 as provided in the first embodiment are not formed in the second embodiment because well contact via structures are provided by replacement of a set of peripheral dummy memory stack structures 155 with a conductive material.

Referring to FIGS. 14A and 14B, an etchant that selectively etches the second material of the sacrificial material layers 42 with respect to the first material of the insulator layers 32 can be introduced into the first-type backside contact openings 79, for example, employing an etch process. The same processing steps can be employed as the processing steps of FIGS. 5A and 5B of the first embodiment. Backside recesses 43 are formed in volumes from which the sacrificial material layers 42 are removed. The removal of the second material of the sacrificial material layers 42 can be selective to the first material of the insulator layers 32, the semiconductor material of the semiconductor material layer 10, and the material of the outermost layer of the memory films (52, 54). In one embodiment, the sacrificial material layers 42 can include silicon nitride, and the materials of the insulator layers 32 can be selected from silicon oxide and dielectric metal oxides. The same chemistry can be employed for the isotropic etch with the etchant as in the first embodiment.

Figures 15A, 15B:
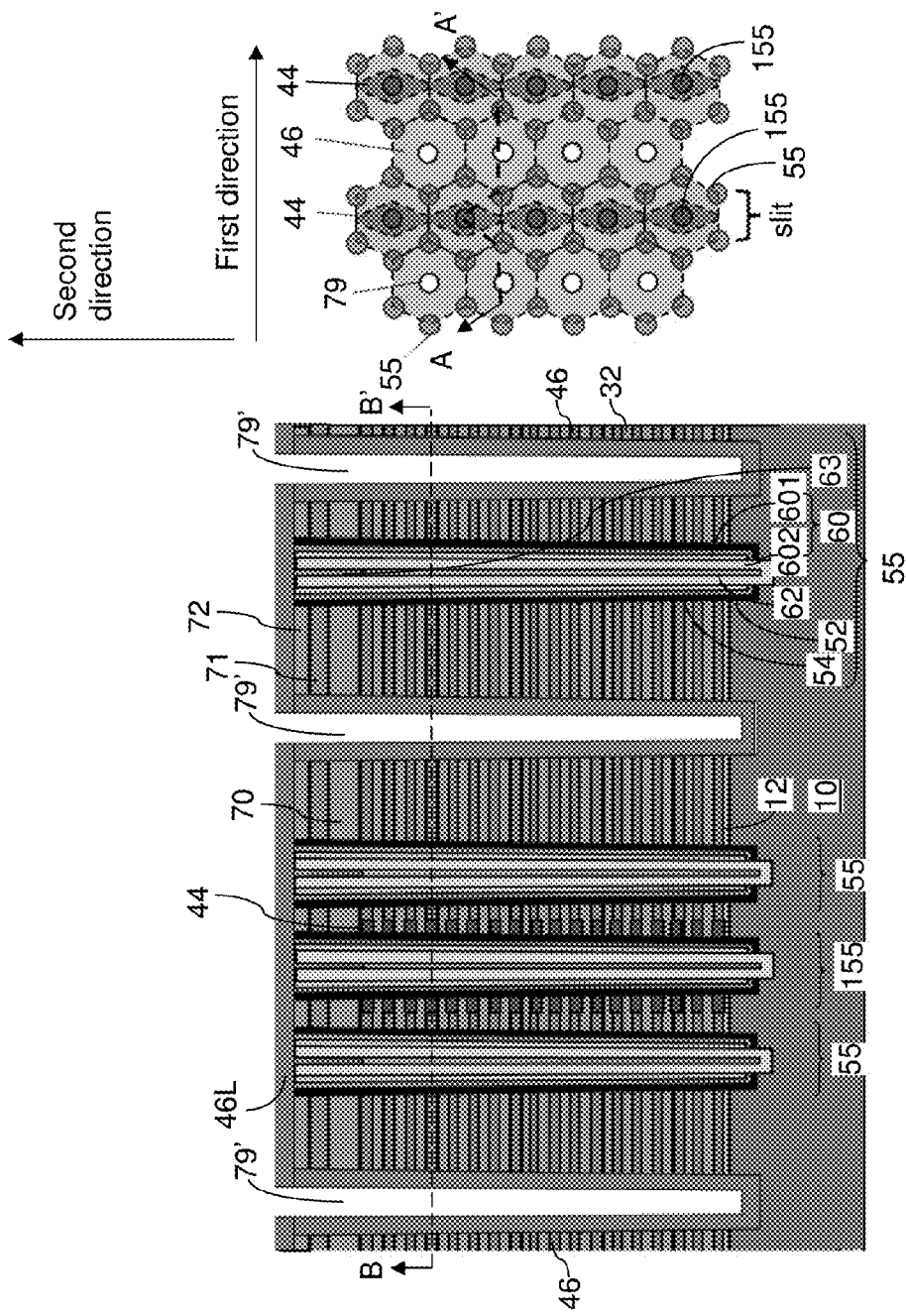
FIG. 15A is a schematic vertical cross-sectional view of the second exemplary structure after formation of electrically conductive layers and a contiguous conductive material layer according to the second embodiment of the present disclosure.
FIG. 15B is a schematic horizontal cross-sectional view of the second exemplary structure of FIG. 15A with a juxtaposed hexagonal lattice structure according to the second embodiment of the present disclosure.

Referring to FIGS. 15A and 15B, electrically conductive layers 46 and a contiguous conductive material layer 46L can be formed employing the same processing steps as the processing steps of FIGS. 6A and 6B of the first embodiment.

Figures 16A, 16B:
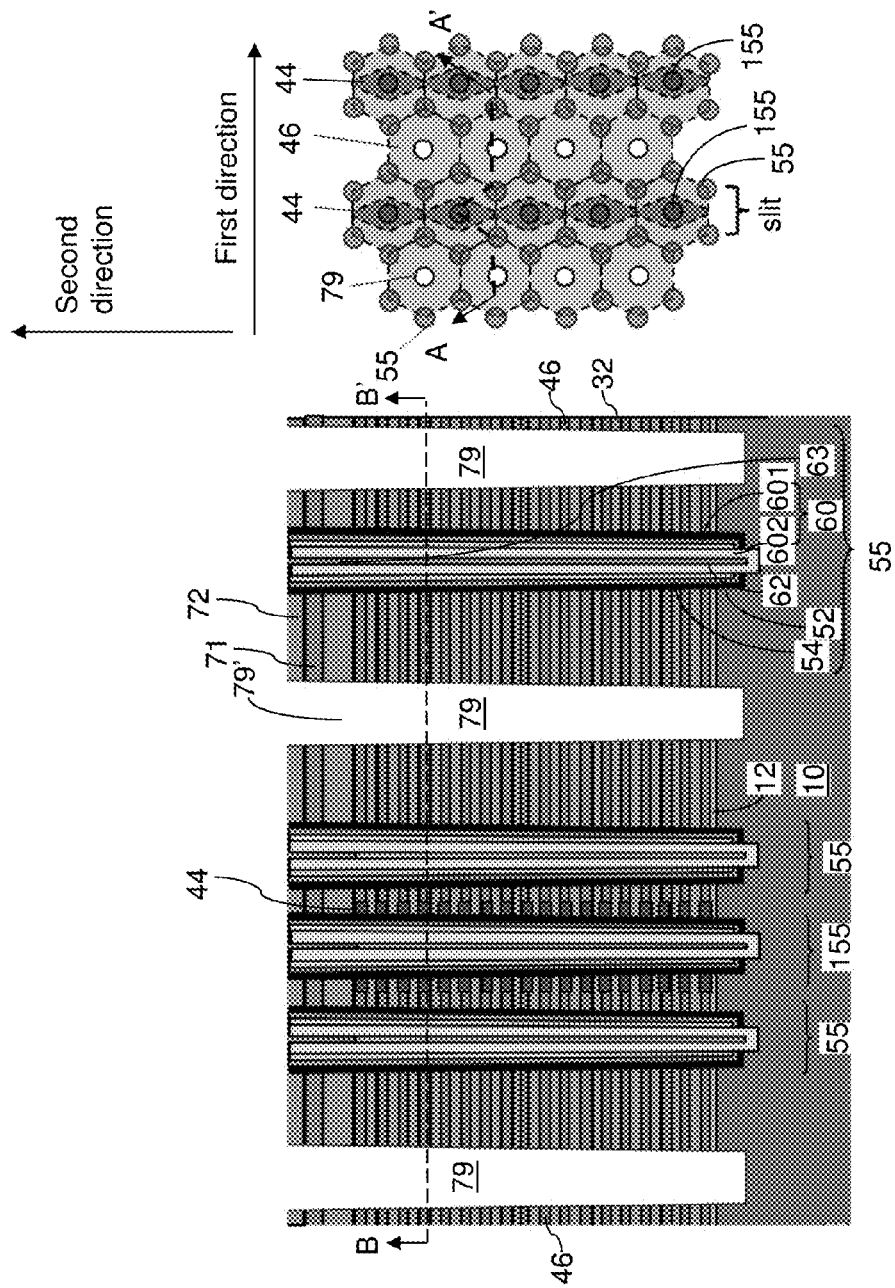
FIG. 16A is a schematic vertical cross-sectional view of the second exemplary structure after removal of the contiguous conductive material layer according to the second embodiment of the present disclosure.
FIG. 16B is a schematic horizontal cross-sectional view of the second exemplary structure of FIG. 16A with a juxtaposed hexagonal lattice structure according to the second embodiment of the present disclosure.

Referring to FIGS. 16A and 16B, the contiguous conductive material layer 46L can be removed employing the same processing steps as the processing steps of FIGS. 7A and 7B of the first embodiment.

Referring to FIGS. 17A and 17B, a conformal dielectric material layer 74 can be formed employing the same processing steps of the processing steps of FIGS. 8A and 8B of the first embodiment.

Referring to FIGS. 18A and 18B, a gapfill material layer 187 and a photoresist layer 188 can be sequentially formed. The first-type backside contact openings (which can be source contact openings) can be filled with the gapfill material layer 187. The gapfill material layer 187 is a sacrificial conformal material layer that temporarily fills the cavities within the first-type backside contact openings. The gapfill material layer 187 can comprise a dielectric material that is different from the dielectric material of the conformal dielectric material layer 74. In one embodiment, the gapfill material layer 187 can comprise silicon nitride.

The photoresist layer 188 can be subsequently formed over the gapfill material layer 187. Alternatively, a dielectric material layer can be formed over the gapfill material layer 197 and a photoresist layer can be formed over the dielectric material layer. In one embodiment, the dielectric material layer can include a self-planarizing material such as spin-on glass.

Figures 19A, 19B:
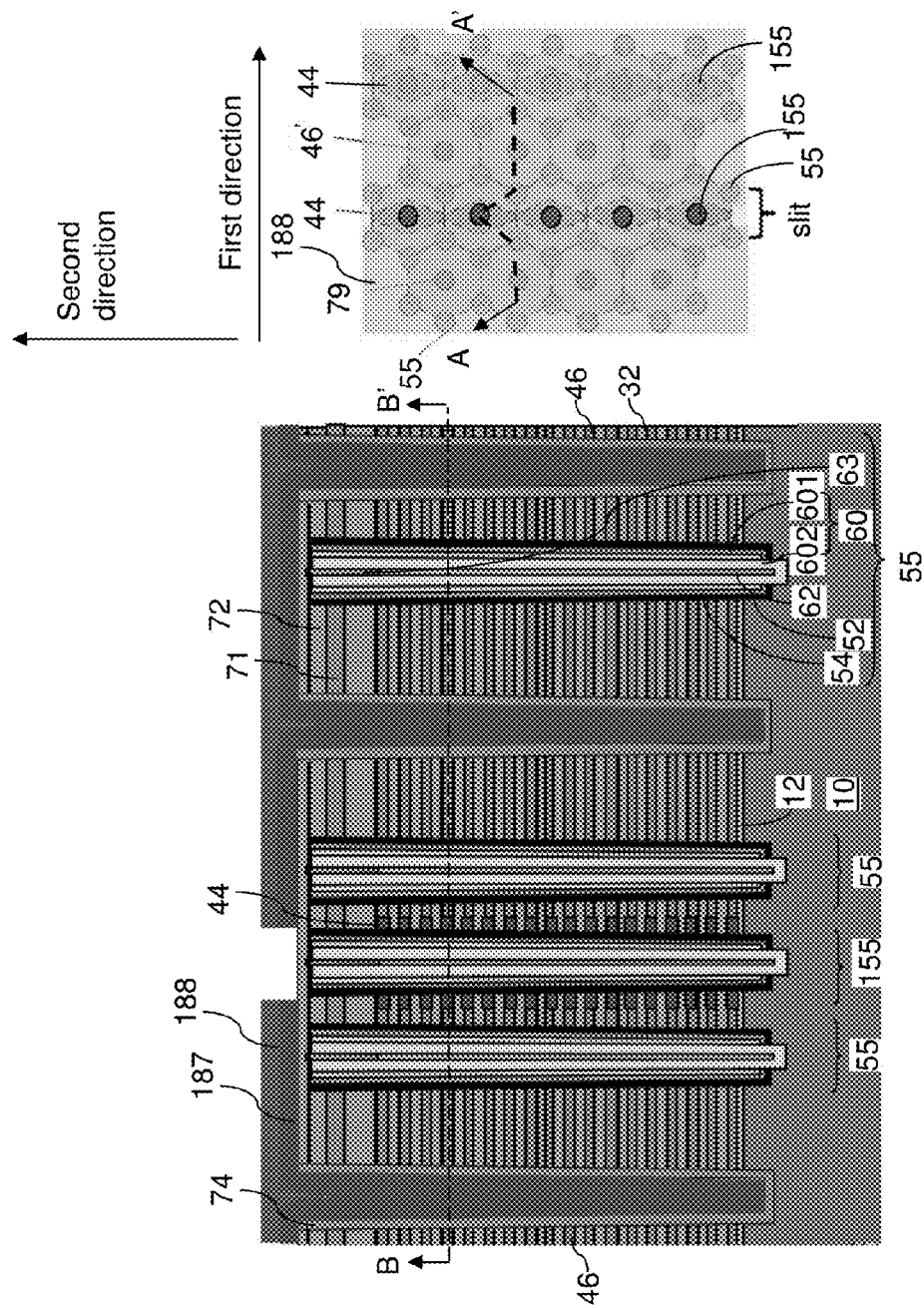
FIG. 19A is a schematic vertical cross-sectional view of the second exemplary structure after patterning of the photoresist layer and the gapfill material layer according to the second embodiment of the present disclosure.
FIG. 19B is a composite view in which a schematic horizontal cross-sectional view of the second exemplary structure of FIG. 19A along the plane B-B' is juxtaposed with a semi-transparent top-down view of the second exemplary structure of FIG. 19A according to the second embodiment of the present disclosure. A hexagonal lattice structure is juxtaposed to the composite view.

Referring to FIGS. 19A and 19B, the photoresist layer can be lithographically patterned to form openings in areas overlying a subset of the dummy memory stack structures 155, which can be arranged as a first one-dimensional array extending along the second horizontal direction. The subset of the dummy memory stack structures 155 can be less than the entirety of the dummy memory stack structures 155. The pattern in the photoresist layer can be transferred into the gapfill material layer 187 by an anisotropic etch. A top surface of each dummy memory stack structure 155 (which is formed within a dummy memory opening) that underlies one of the openings in the photoresist layer is physically exposed.

Figures 20A, 20B:
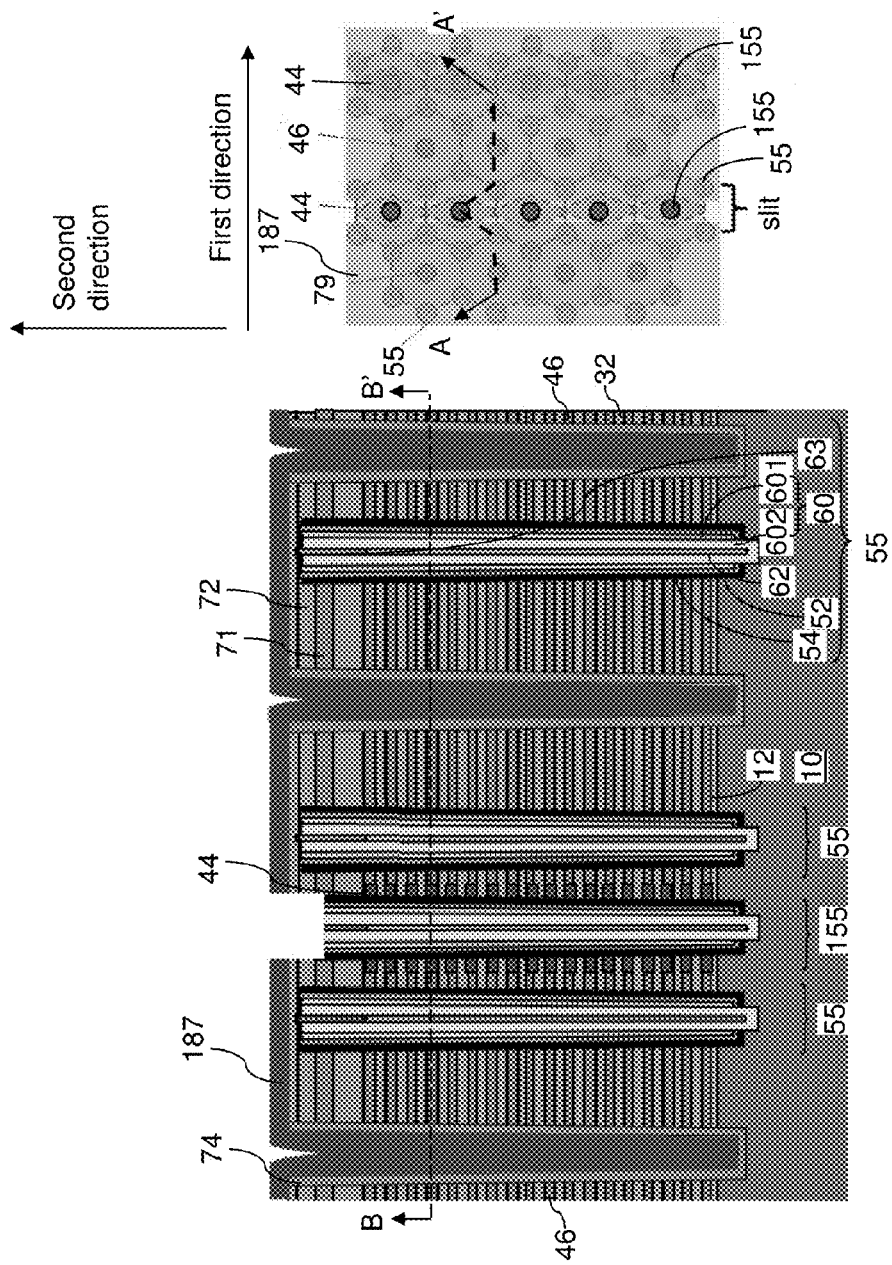
FIG. 20A is a schematic vertical cross-sectional view of the second exemplary structure after patterning of a line trench above a set of dummy memory stack structures according to the second embodiment of the present disclosure.
FIG. 20B is a composite view in which a schematic horizontal cross-sectional view of the second exemplary structure of FIG. 20A along the plane B-B' is juxtaposed with a semi-transparent top-down view of the second exemplary structure of FIG. 20A according to the second embodiment of the present disclosure. A hexagonal lattice structure is juxtaposed to the composite view.

Referring to FIGS. 20A and 20B, the photoresist layer (or a combination of the photoresist layer and a dielectric material layer overlying the gapfill material layer 187) can be removed, for example, by ashing. The patterned gapfill material layer 187 can be employed as an etch mask to anisotropically etch the conformal dielectric material layer 74 and the at least one insulating cap layer (70, 71, 72).

Referring to FIGS. 21A and 21B, portions of the dummy memory stack structures 155 other than the memory films (52, 54) can be removed by an anisotropic etch. In one embodiment, the drain regions 63, the dielectric cores 62, and the vertical semiconductor channels 60 can be removed by an anisotropic etch process that is selective to any of the dielectric materials of the memory films (52, 54). For example, the drain regions 63, the dielectric cores 62, and the vertical semiconductor channels 60 can be removed by an anisotropic etch process that is selective to the dielectric material of the tunneling dielectrics, to the dielectric material of the charge storage layer, and/or to the dielectric material of the at least one blocking dielectric layer 52. Thus, the vertical semiconductor channels 60 within the dummy memory openings are removed. A second-type backside contact openings 29 can be formed within each remaining portion of the dummy memory stack structures 155.

Horizontal portions of the memory films (52, 54) can be removed from underneath the well contact via cavities 29 by extending the anisotropic etch after the entirety of the drain regions 63, the dielectric cores 62, and the vertical semiconductor channels 60 is removed. A surface portion of the semiconductor material layer 10 can be collaterally etched to physically expose sidewalls of the semiconductor material layer 10 at the bottom of each second-type backside contact opening 29. The second-type backside contact openings can be well contact via trenches.

Referring to FIGS. 22A and 22B, the gapfill material layer 187 is removed selective to the conformal dielectric material layer 74, the at least one insulating cap layer (70, 71, 72), the remaining portions of the memory films (52, 54), and the semiconductor material layer 10. For example, if the gapfill material layer 187 comprises silicon nitride, a wet etch employing phosphoric acid can be employed to remove the gapfill material layer 187. A backside contact via cavity 79' can be formed within each unfilled volume of a first-type contact via trench.

Figures 23A, 23B:
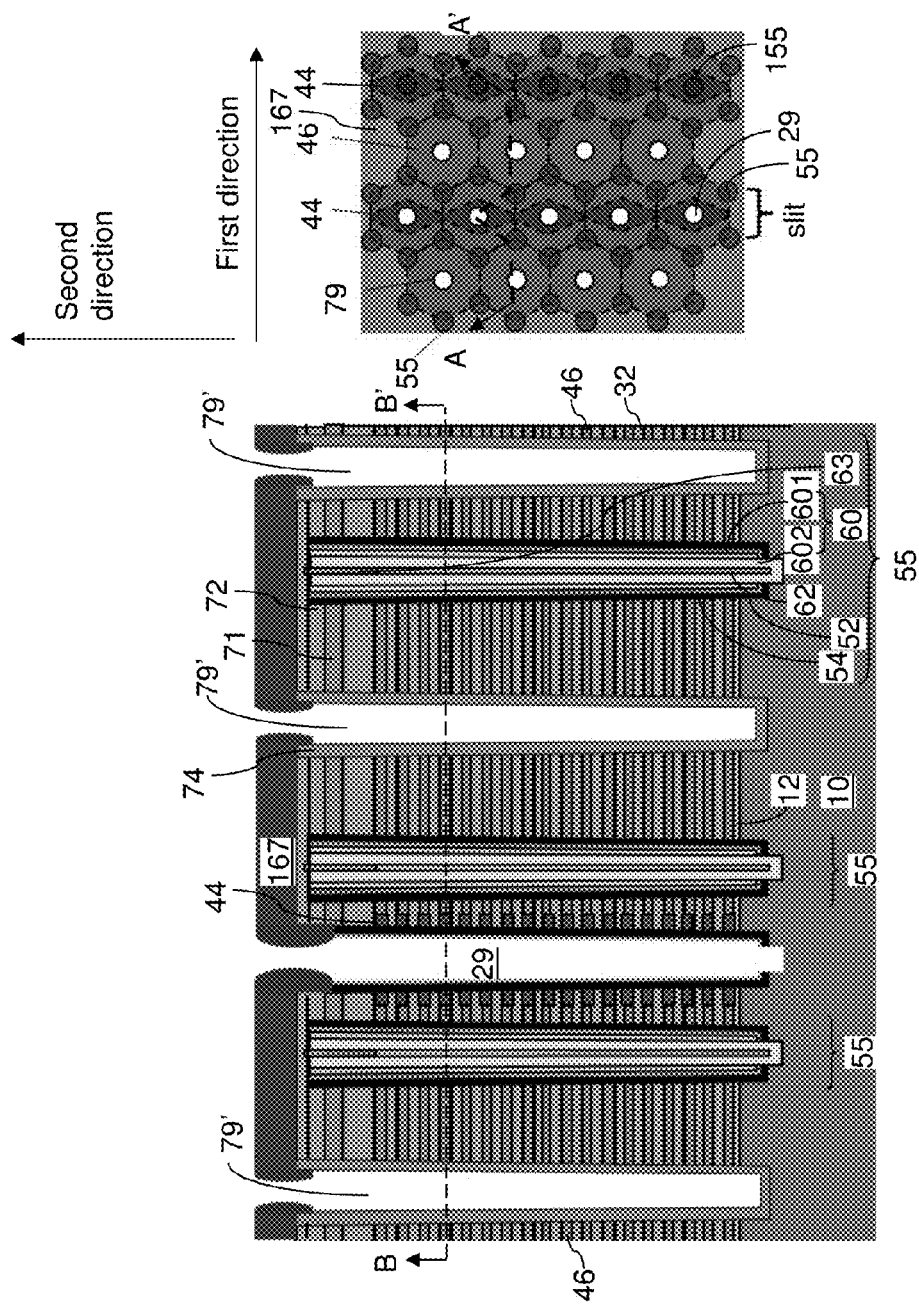
FIG. 23A is a schematic vertical cross-sectional view of the second exemplary structure after formation of a conformal dielectric material layer and a non-conformal hard mask layer according to the second embodiment of the present disclosure.
FIG. 23B is a composite view in which a schematic horizontal cross-sectional view of the second exemplary structure of FIG. 23A along the plane B-B' is juxtaposed with a semi-transparent top-down view of the second exemplary structure of FIG. 23A according to the second embodiment of the present disclosure. A hexagonal lattice structure is juxtaposed to the composite view.

Referring to FIGS. 23A and 23B, a non-conformal hard mask layer 167 can be deposited over the at least one insulating cap layer (70, 71, 72) employing the same processing steps as in the processing steps of FIGS. 8A and 8B of the first embodiment.

Figures 24A, 24B:
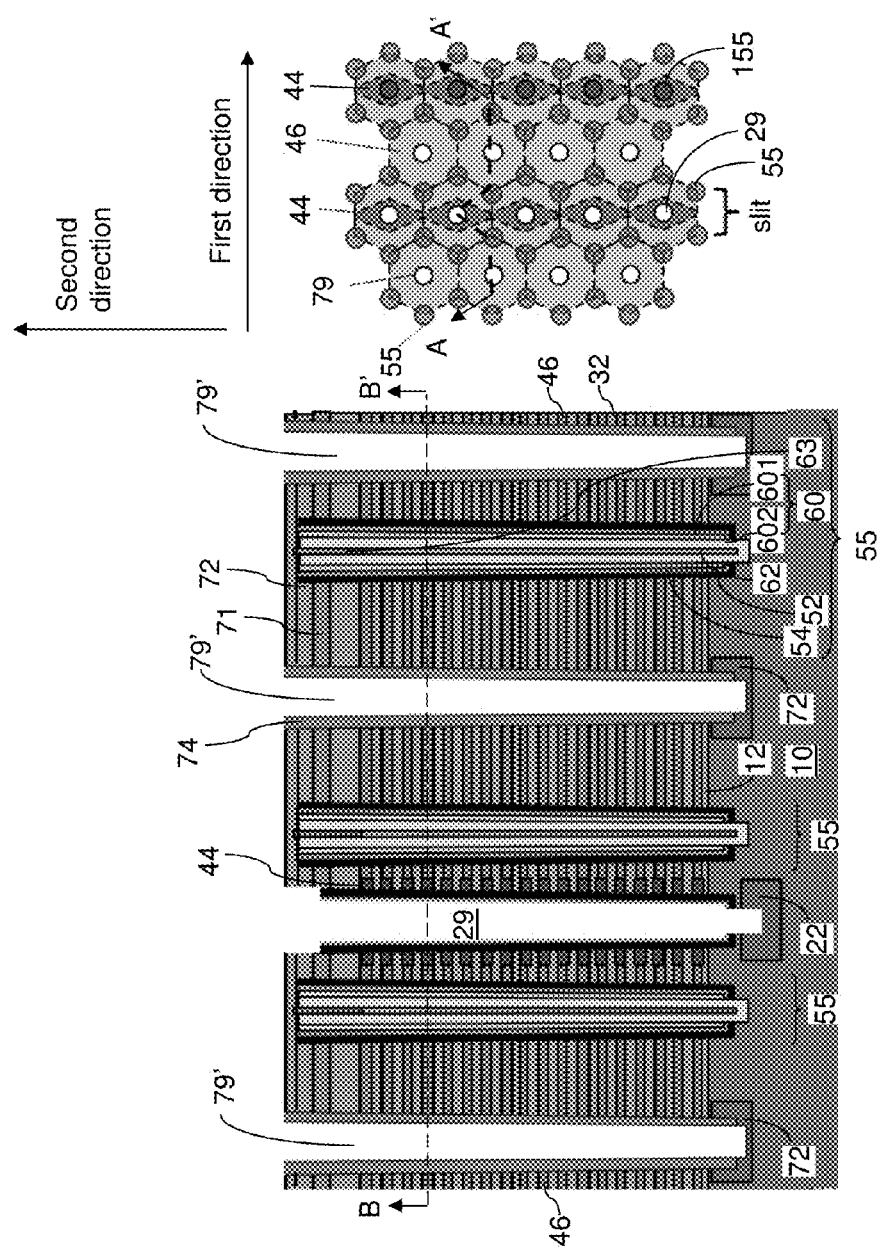
FIG. 24A is a schematic vertical cross-sectional view of the second exemplary structure after formation of a non-conformal hard mask layer according to the second embodiment of the present disclosure.
FIG. 24B is a schematic horizontal cross-sectional view of the second exemplary structure of FIG. 24A with a juxtaposed hexagonal lattice structure according to the second embodiment of the present disclosure.

Referring to FIGS. 24A and 24B, an anisotropic etch can be performed to etch the portions of the conformal dielectric material layer 74 that underlies the backside contact via cavities 79'. Surfaces of the semiconductor material layer 10 can be physically exposed at the bottom of the first-type backside contact openings 79 and the second-type backside contact openings 29.

The remaining portions of the conformal dielectric material layer 74 is a single contiguous layer including vertically extending portions into the first-type backside contact openings 79 and a horizontal portion adjoined to each vertical portion. Each vertically extending portion of the conformal dielectric material layer 74 constitutes an insulating spacer that laterally separates the alternating stack (32, 46) of the insulator layers 32 and the electrically conductive layers 46 from contact via structures to be subsequently formed inside the first-type backside contact openings 79.

A masked ion implantation process can be employed to implant electrical dopants of a first conductivity type into portions of the semiconductor material layer 10 that underlie the first-type backside contact openings 79 to form source regions 72. The source regions 72 can have a same type of doping as the drain regions 63. The source regions 72 and the drain regions 63 can have a doping of the opposite conductivity type of the doping of the semiconductor channels 60.

Another masked ion implantation process can be employed to implant electrical dopants of the second conductivity type into portions of the semiconductor material layer 10 that underlie the second-type backside contact openings 29 to form well contact regions 22. The well contact regions 22 can have the same conductivity type as the semiconductor material layer 10, of which can be employed as a channel portion of the memory stack structures 55. The well contact regions 22 can have a doping of the same conductivity type as the semiconductor channels 60. The well contact regions 22 can be employed to electrically bias selected portions of the semiconductor material layer 10.

Figure 25A:
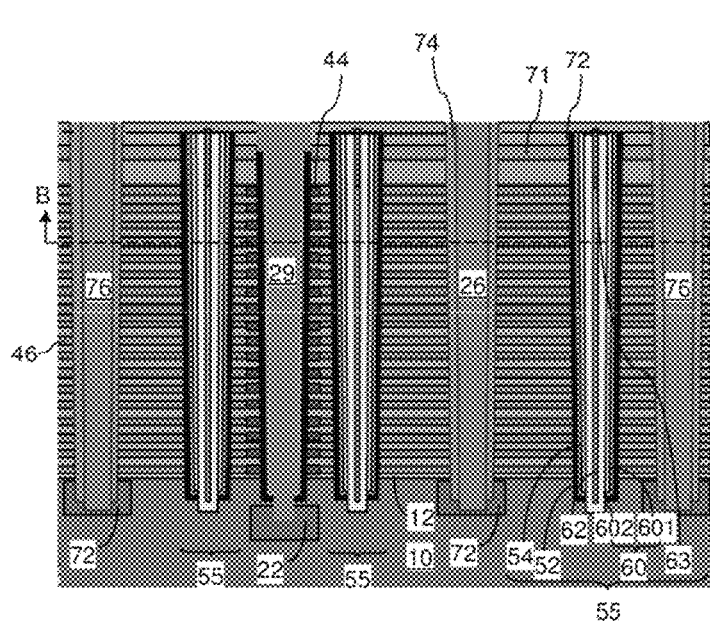
FIG. 25A is a schematic vertical cross-sectional view of the second exemplary structure after formation of second-type contact via structures and second-type contact via structures according to the second embodiment of the present disclosure.
Figure 25B:
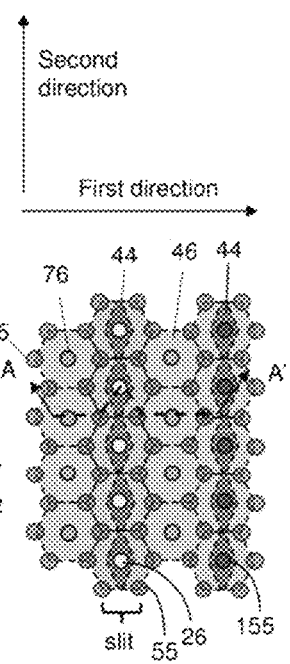
FIG. 25B is a schematic horizontal cross-sectional view of the second exemplary structure of FIG. 25A with a juxtaposed hexagonal lattice structure according to the second embodiment of the present disclosure.
Figure 26A:
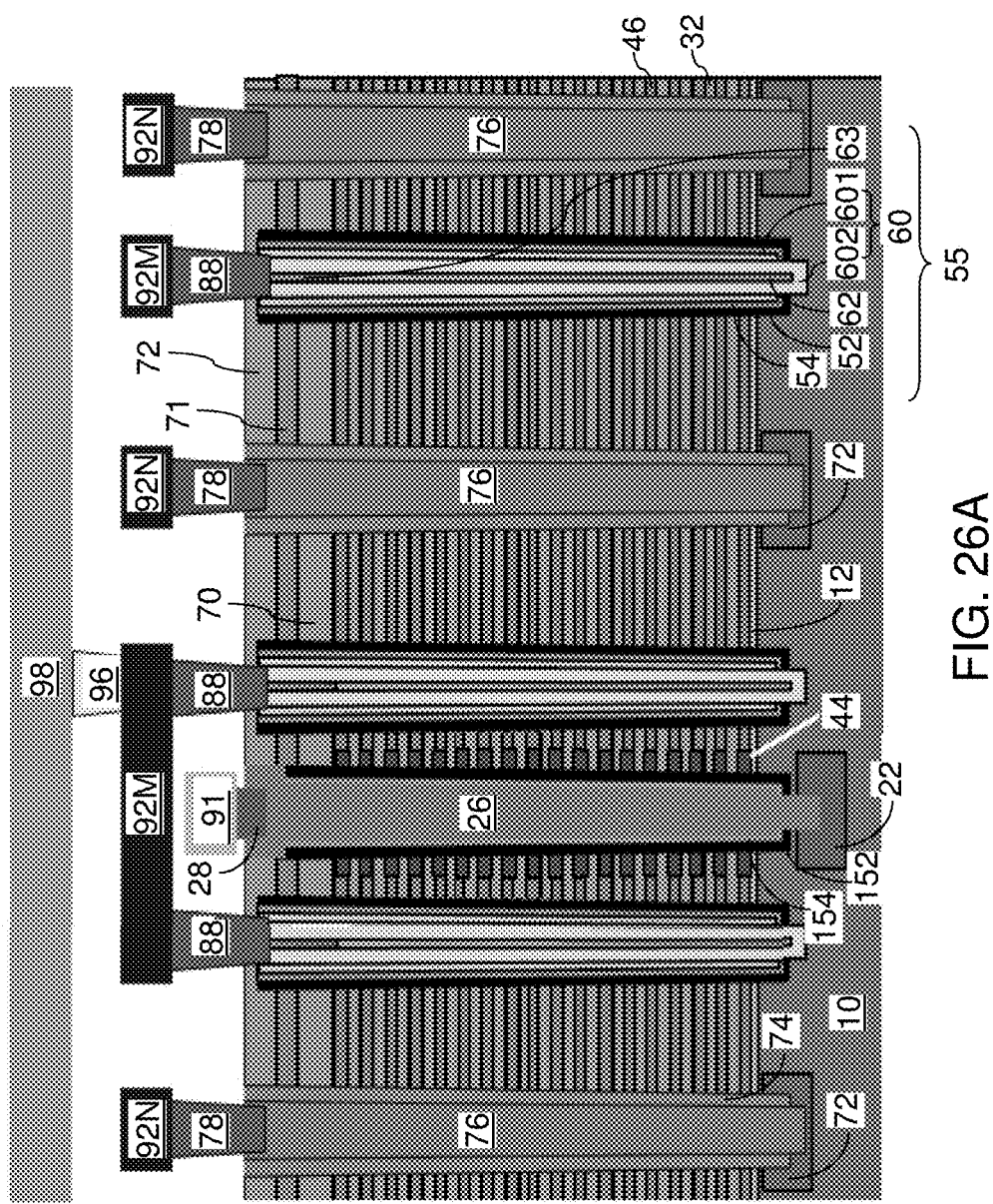
FIG. 26A is a schematic vertical cross-sectional view of the second exemplary structure after formation of various metal interconnect structures according to the second embodiment of the present disclosure.
Figure 26B:
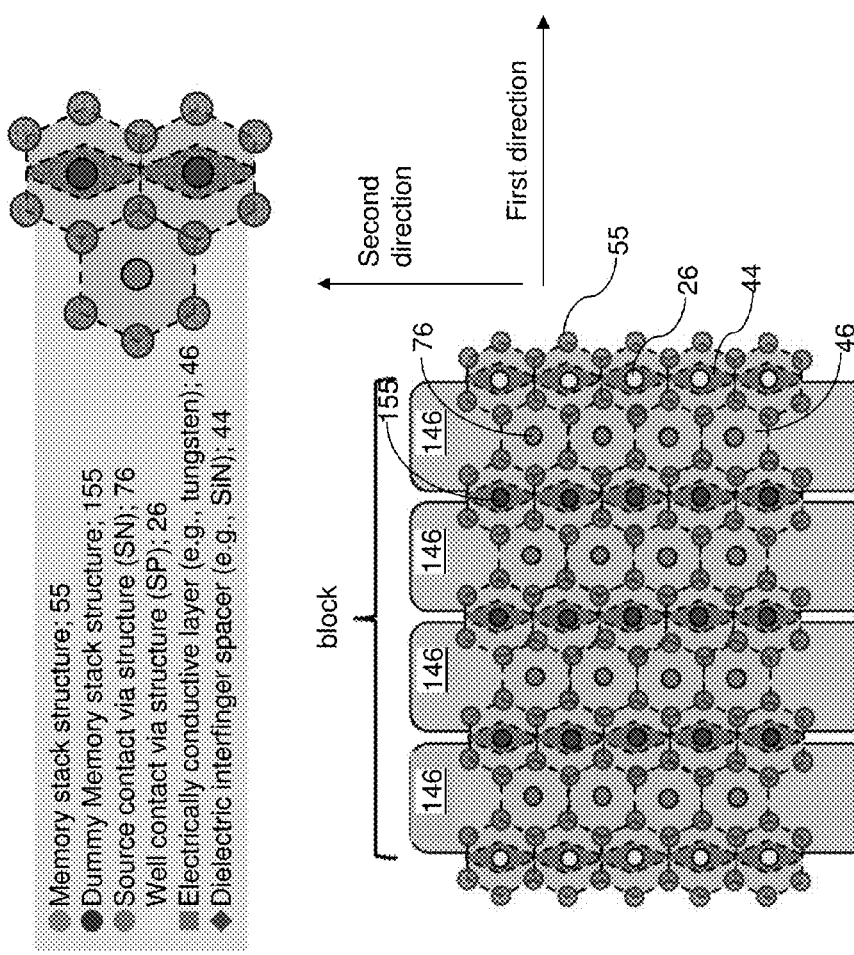
FIG. 26B is a schematic horizontal cross-sectional view of the second exemplary structure of FIG. 26A according to the second embodiment of the present disclosure.
Figure 26D:
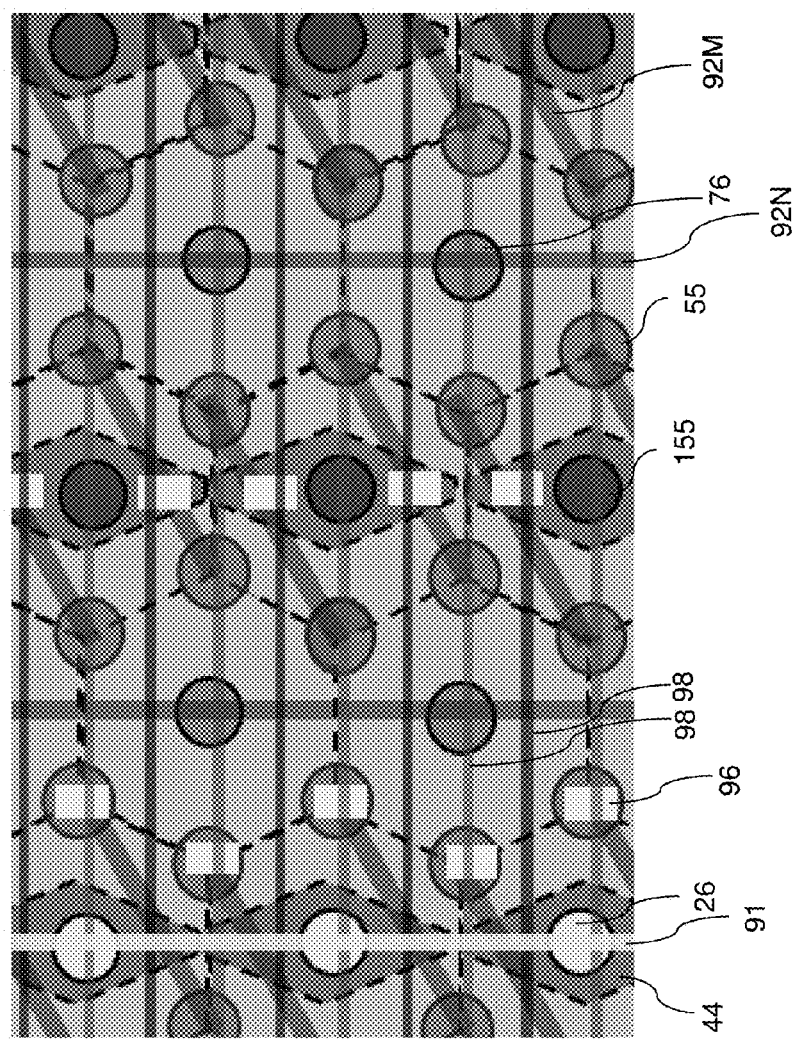
FIG. 26D is a magnified view of a portion of the wiring schematic of FIG. 26C according to the second embodiment of the present disclosure.

Referring to FIGS. 25A and 25B, each cavity laterally surrounded by insulating spacers (i.e., the vertically extending portions of the conformal dielectric material layer 74) or remaining portions of memory films (52, 54) within dummy memory openings can be simultaneously filled with a conductive material to form contact via structures (76, 26). For example, a source contact via structure 76 can be formed within each cavity derived from a first-type contact via trench 79 (which can be a source contact opening), and a well contact via structure 26 can be formed within each cavity derived from a second-type contact via trench 29 (which can be a well contact opening). Excess portions of the deposited conductive material can be removed from above the horizontal portion of the conformal dielectric material layer 74, for example, by chemical mechanical planarization and/or a recess etch.

Referring to FIGS. 26A-26D, metal interconnect structures (88, 78, 28, 91, 92M, 92N, 96, 98) and dielectric material layers (not shown) can be formed over the at least one insulating cap layer (70, 71, 72) to provide electrical connection to the drain regions 63 within the memory stack structures 55, to the source contact via structures 76, and to the well contact via structures 26.

For example, a lower via level dielectric layer (not shown) can be formed over the conformal dielectric material layer 74. Well interconnect via structures 28 can be formed through the lower via level dielectric layer and directly on the contact well contact via structures 26. A lower line level dielectric layer (not shown) can be subsequently formed over the well interconnect via structures 28. A well interconnect line structure 91 (which is a well bias line structure the performs the function of the well bias line structures 92P in FIG. 11A of the first embodiment but is formed at a lower level) can be formed on the top surfaces of a set of well interconnect via structures 28 within a one dimensional array that extend along the second horizontal direction.

Subsequently, an upper via level dielectric layer (not shown) and various first level contact via structures (88, 78) can be formed. The various first level contact via structures can include drain contact via structures 88 that contact drain regions 63, and source interconnect via structures 78 that contact source contact via structures 76. A first line level dielectric layer (not shown) and first level line structures (92M, 92N) can be subsequently formed. The first level line structures (92M, 92N) include memory stack interconnect line structures 92M that contact drain contact via structures 88, and source line structures 92N that contacts the source interconnect via structures 78. The memory stack interconnect structures 92M can provide local interconnection among drain regions 63 located at vertices of a same hexagon within the hexagonal lattice as illustrated in FIGS. 25C and 25D.

A second via level dielectric layer (not shown) and various second level contact via structures 96 can be formed. A first subset of the second level contact via structures 96 can be employed to provide vertical electrical connection to the memory stack interconnect line structures 92M. A second subset of the second level contact via structures 96 can be employed to provide vertical electrical connection to the source line structures 92N. A third subset of the second level contact via structures 96 can be employed to provide vertical electrical connection to the well bias line structures 91. A second line level dielectric layer and second level line structures 98 can be formed to provide further electrical connection.

Each finger 146 of an electrically conductive layer 46 can be laterally disjoined from a neighboring finger of the electrically conductive layer 46 located at the same level by a dielectric material portion 44. The dielectric material portions 44 can be of a first type that laterally surrounds a one dimensional array of remaining second memory stack structures 155, which are dummy memory stack structures that are not contacted by any metal interconnect structure. Alternatively or additionally, the dielectric material portions 44 can be of a second type that laterally surrounds a one dimensional array of well contact via structures 26, which are formed within remaining portions of the memory films (52, 54) of a subset of second memory stack structures 155 from which at least the respective vertical semiconductor channels 60 are removed. Each dielectric material portion can extend along the second horizontal direction, and can have an undulating width (which is measured along the first horizontal direction).

Thus, upon formation of metal interconnect structures (structures (88, 78, 28, 91, 92M, 92N, 96, 98) over the first memory stack structures 55 and the optional second memory stack structures 155, each first memory stack structure 55 in the memory openings contacts a respective drain contact via structure 63, and each second memory stack structure 155 located in the dummy memory openings does not contact any of the metal interconnect structures (88, 78, 28, 91, 92M, 92N, 96, 98).

The second exemplary structure comprises a monolithic three-dimensional memory device, which incorporates the features of the first exemplary structure except for modifications due to formation of the well contact via structures 26 through replacement of materials of a subset of second memory stack structures 155.

In the second exemplary structure, each of the source contact via structures 76 can be laterally surrounded by an insulating spacer (i.e., a vertical portion of a conformal dielectric material layer 74) that contacts the electrically conductive layers 46 and the insulating layers 32. Each of the well contact via structures 26 can be laterally surrounded by a second vertically spaced stack of dielectric material portions 44. In one embodiment, each of the well contact via structures 26 can be laterally surrounded by a remaining portion of a memory film (52, 54), which is a dielectric spacer having a same composition as the memory films (52, 54).

In one embodiment, drain contact via structures 88 contacts a respective drain region 63 within the memory stack structures 55. Well interconnect via structures 28 contact a top surface of a respective well contact via structure 26 and a bottom surface of a well interconnect line structure 91. A top surface of the well interconnect line structure 91 can be located below a horizontal plane including top surfaces of the drain contact via structures 88. In one embodiment, a portion of the electrically conductive layers 46 laterally surrounds the source contact via structures 76 and contacts a respective dielectric material portion within a second vertically spaced stack of dielectric material portions 44 at each level of the electrically conductive layers 46.

FIGS. 11A, 11C, 11D, 26A, 26C and 26D illustrate the location of the metal interconnect structures with respect to the underlying imaginary hexagons. Each memory stack interconnect line structure 92M extends over a dielectric material portion 44 to connect two memory stack structures 55 located at two vertices of the imaginary hexagon which spans the dielectric material portion 44. Specifically, each memory stack interconnect line structure 92M extends diagonally over a dielectric material portion 44 to connect two memory stack structures 55 located at two non-adjacent vertices of the imaginary hexagon in the first subset of hexagons, such as at two vertices which are separated by one additional vertex of the hexagon.

Out of the plurality of first subsets of hexagons which extend in the second horizontal direction, the memory stack interconnect line structures 92M in odd numbered first subsets are electrically connected by respective second level contact via structures 96 to either odd or even numbered bit lines 98. The memory stack interconnect line structures 92M in even numbered first subsets are electrically connected by respective second level contact via structures 96 to the other ones of odd or even numbered bit lines 98. This allows each bit line 98 to activate two memory stack structures 55 (e.g., to supply current to the drain regions 63 of two NAND strings) located on opposite sides of the dielectric material portion 44 out of six memory structures 55 in each hexagon of the first subset of hexagons. Since the dielectric material portion 44 separates adjacent word line fingers 146 (i.e., control gate fingers) from each other, each bit line can simultaneously activate two adjacent NAND strings which are controlled by different word line fingers 146 (i.e., different word line/control gate stacks). Thus, by activating a given bit line 98, charge carriers (e.g., electrons) are injected from drain regions 63 into adjacent channels 60 of two different NAND strings which are controlled by different word lines/control gates. The control gates in one or more selected vertical device levels in a selected finger 146 may then be activated to program (e.g., write or erase) or read a selected memory cell in a NAND string.

Each source line structure 92 extends in the second horizontal direction across a respective second subset of hexagons, to electrically connect the source contact via structures 76 located in the middle of each hexagon in the second subset of hexagons. Preferably, the memory stack interconnect line structures 92M do not extend across the hexagons of the second subset of hexagons, but contact the memory stack structures located at the vertices of such hexagons.

Figure 27:
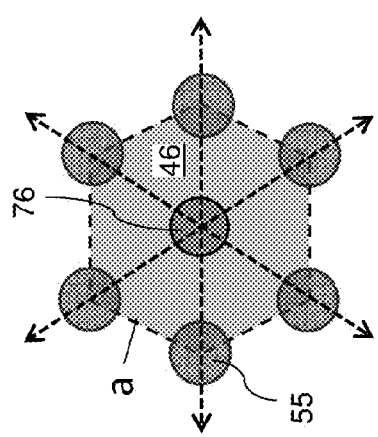
FIG. 27 is an exemplary configuration of a hexagonal lattice structure containing memory stack structures and a first-type contact via structure according to an embodiment of the present disclosure.

The hexagonal lattice may employ regular hexagons or elongated hexagons. FIG. 27 is a schematic illustrating placement of the memory stack structures 55 at vertices of a regular hexagon, and placement of a source contact via structure 76 at the center of the regular hexagon. Since a regular hexagon is employed in the hexagonal lattice, the center-to-center distance between any adjoining pair of memory stack structures 55 is the same, e.g., the same distance "a." The center-to-center distance between the source contact via structure 76 and any of the memory stack structures 55 is also the same, e.g., the same distance "a." The design of FIG. 27 can be employed in the first and second exemplary structures.

Figure 28A:
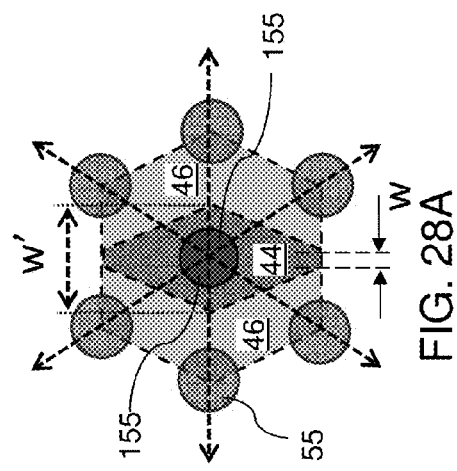
FIG. 28A is a first exemplary configuration of a hexagonal lattice structure containing a dielectric material portion according to an embodiment of the present disclosure.
Figure 28B:
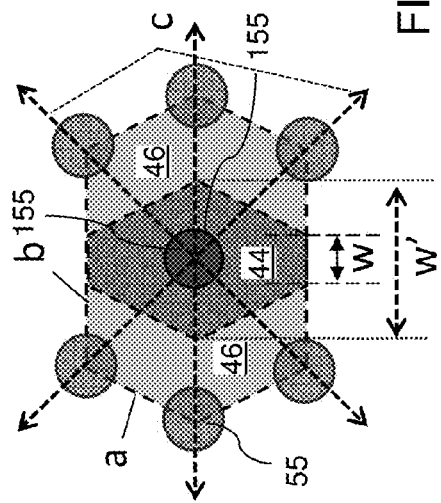
FIG. 28B is a second exemplary configuration of a hexagonal lattice structure containing a dielectric material portion according to an embodiment of the present disclosure.

FIGS. 28A and 28B illustrate first and second exemplary hexagons that can be employed for the hexagonal lattice of the present disclosure. FIG. 28A illustrate a configuration employing a regular hexagon, and FIG. 28B illustrate a configuration employing an elongated hexagon. The hexagon corresponds to a location at which six first memory stack structures 55 surrounds a second memory stack structure 155, which is a dummy memory stack structure. The center-to-center distance for four neighboring pairs of memory stack structures 55 on vertices of an elongated hexagon can be a first dimension, e.g., "a," and the center-to-center distance for two neighboring pair of memory stack structures 55 on vertices of an elongated hexagon can be a second dimension. E.g., "b," such that b is greater than a. Each dielectric material portion 44 has a thickness undulation along the second horizontal direction. In other words, the lateral thickness measured between the outer sidewalls of each dielectric material portion 44 along the first horizontal direction changes as the location of measurement changes along the second horizontal direction. The maximum lateral thickness of a dielectric material portion 44 is marked as "w'," and the minimum lateral thickness of the dielectric material portion 44 is marked as "w."

Elongation of the hexagon increases process tolerance for ensuring that each dielectric material portion 44, which is a remaining unetched portion of a second material layer, be formed as a contiguous structure that extends along the second horizontal direction without being cut into multiple pieces. Thus, elongation of the hexagon along the first horizontal direction increases process tolerance for preventing electrical shorts between two portions of the electrically conductive layer 46, e.g., between a portion of the electrically conductive layer 46 located on the left side of FIG. 28B (which can be a first control gate electrode) and a portion of the electrically conductive layer 46 located on the right side of FIG. 28B (which can be a second control gate electrode).

Figure 29B:
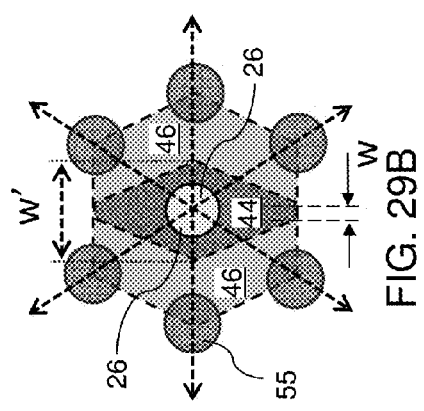
FIG. 29B is a second exemplary configuration of a hexagonal lattice structure containing a second-type contact via structure according to an embodiment of the present disclosure.
Figure 29A:
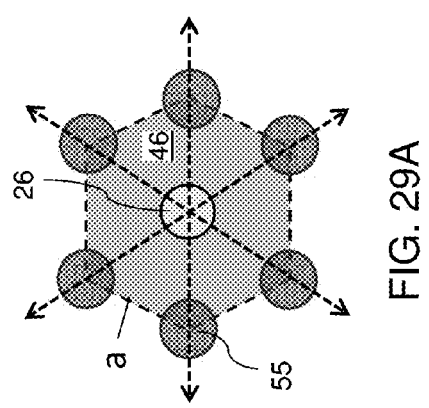
FIG. 29A is a first exemplary configuration of a hexagonal lattice structure containing a second-type contact via structure according to an embodiment of the present disclosure.
Figure 29C:
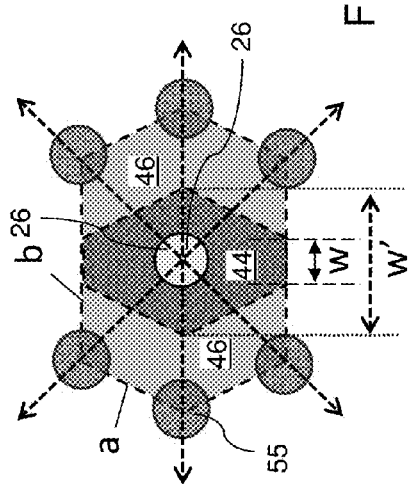
FIG. 29C is a third exemplary configuration of a hexagonal lattice structure containing a second-type contact via structure according to an embodiment of the present disclosure.

Referring to FIGS. 29A-29C, similar design variations can be employed for each hexagon within which a well contact via structure 26 is formed in lieu of a dummy memory stack structure 155. The design of FIG. 29A can be employed in the first exemplary structure. The designs of FIGS. 29B and 29C can be employed in the second exemplary structure.

The exemplary structures of the present disclosure do not employ a slit trench for formation of source contact via structures and/or well contact via structures. Instead, the spatial extent of each source contact via structure 76 and the spatial extent of each well contact via structure 26 can be laterally confined inside a hexagonal lattice, thereby providing a compact design and increased device density.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
  a stack of an alternating plurality of insulator layers and electrically conductive layers located over a substrate;
  a plurality of memory stack structures located at vertices of hexagons of a hexagonal lattice and over the substrate; and
  a plurality of dummy memory stack structures located at each center of a first subset of the hexagons,
  wherein:
    each of the memory stack structure and the dummy memory stack structures comprises a memory film and a vertical semiconductor channel;
    the electrically conductive layers contact outer sidewalls of the plurality of memory stack structures;
    outer sidewalls of the plurality of dummy memory stack structures are laterally spaced from the electrically conductive layers by a vertically spaced stack of dielectric material portions located at each level of the electrically conductive layers, wherein each dielectric material portion continuously extends through a region of the first subset of the hexagons and contacts an outermost sidewall of each dummy memory stack structure among the plurality of dummy memory stack structures and is laterally spaced from, and does not physically contact, any of the plurality of memory stack structures within the hexagonal lattice;
    each hexagon of the hexagonal lattice has a pair of sides that are parallel to a first horizontal direction and perpendicular to a second horizontal direction;
    the first subset of the hexagons constitutes a first one-dimensional array extending along the second horizontal direction; and
    the monolithic three-dimensional memory device comprises at least one feature selected from:
      a first feature that the monolithic three-dimensional memory device further comprises: source contact via structures located at each center of a second subset of hexagons that forms a second one-dimensional array that extends along the second horizontal direction, each source contact via structure being electrically shorted to a respective source region located over, or within, the substrate, and each source region contacting a horizontal semiconductor channel within the substrate, and further comprises well contact via structures located at each center of a third subset of hexagons that forms a third one-dimensional array that extends along the second horizontal direction, each well contact via structure being electrically shorted to a doped well having a doping of an opposite conductivity type than the source regions; and
      a second feature that each dielectric material portion among the vertically spaced stack of dielectric material portions has an undulating width that is measured along the first horizontal direction and changes with a distance along the second horizontal direction.

2. The monolithic three-dimensional memory device of claim 1, wherein:

each vertical semiconductor channel of the memory stack structures is electrically contacted by a respective overlying contact via structure; and each dummy memory stack structure does not electrically contact a conductive material portion above a horizontal plane including a bottommost surface of the alternating plurality of insulator layers and electrically conductive layers.

3. The monolithic three-dimensional memory device of claim 1, wherein each dielectric material portion of the vertically spaced stack laterally extends over multiple hexagons along the second horizontal direction.

4. The monolithic three-dimensional memory device of claim 1, wherein each electrically conductive layer comprises:

a first electrically conductive portion contacting, and located on one side of, a respective dielectric material portion of the vertically spaced stack; and a second electrically conductive portion contacting, and located on an opposite side of, the respective dielectric material portion of the vertically spaced stack, wherein the first electrically conductive portion and the second electrically conductive portion are electrically isolated from each other.

5. The monolithic three-dimensional memory device of claim 1, wherein each dielectric material portion of the vertically spaced stack contacts each outer sidewall of the plurality of dummy memory stack structures.

6. The monolithic three-dimensional memory device of claim 1, wherein the three-dimensional memory device comprises the first feature.

7. The monolithic three-dimensional memory device of claim 6, further comprising:

drain contact via structures contacting a respective drain region within the memory stack structures; and source interconnect via structures contacting a respective source contact via structure, wherein each top surface of the drain contact via structures and source interconnect via structures contacts a bottom surface of a respective interconnect line structure located within a same horizontal plane.

8. The monolithic three-dimensional memory device of claim 6, wherein each of the source contact via structures and the well contact via structures is laterally surrounded by an insulating spacer that contacts the electrically conductive layers and the insulating layers.

9. The monolithic three-dimensional memory device of claim 8, further comprising:

drain contact via structures contacting a respective drain region within the memory stack structures; and well interconnect via structures contacting a respective well contact via structure, wherein each top surface of the drain contact via structures and well interconnect via structures contacts a bottom surface of a respective interconnect line structure located within a same horizontal plane.

10. The monolithic three-dimensional memory device of claim 7, wherein each pair of a well contact structure and a source contact structure is laterally spaced from each other by at least one dielectric material portion having a same composition as the dielectric material portion of the vertically spaced stack.

11. The monolithic three-dimensional memory device of claim 6, wherein:

each of the source contact via structures is laterally surrounded by an insulating spacer that contacts the electrically conductive layers and the insulating layers; and each of the well contact via structures is laterally surrounded by a second vertically spaced stack of dielectric material portions.

12. The monolithic three-dimensional memory device of claim 11, wherein each of the well contact via structures is laterally surrounded by a dielectric spacer having a same composition as the memory films.

13. The monolithic three-dimensional memory device of claim 11, further comprising:

drain contact via structures contacting a respective drain region within the memory stack structures; and well interconnect via structures contacting a top surface of a respective well contact via structure and a bottom surface of a well interconnect line structure, wherein a top surface of the well interconnect line structure is located below a horizontal plane including top surfaces of the drain contact via structures.

14. The monolithic three-dimensional memory device of claim 11, wherein a portion of the electrically conductive layers laterally surrounds the source contact via structures and contacts a respective dielectric material portion within a second vertically spaced stack of dielectric material portions at each level of the electrically conductive layers.

15. The monolithic three-dimensional memory device of claim 1, wherein:

the monolithic three-dimensional memory device comprises a vertical NAND memory device; and the electrically conductive layers comprise, or are electrically connected to, a respective word line of the NAND memory device.

16. The monolithic three-dimensional memory device of claim 15, wherein:

the substrate comprises a silicon substrate;

the NAND memory device comprises an array of monolithic three-dimensional NAND strings over the silicon substrate;

at least one memory cell in the first device level of the three-dimensional array of NAND strings is located over another memory cell in the second device level of the three-dimensional array of NAND strings;

the silicon substrate contains an integrated circuit comprising a driver circuit for the memory device located thereon; and each NAND string comprises:

a plurality of semiconductor channels, wherein at least one end portion of each of the plurality of semiconductor channels extends substantially perpendicular to a top surface of the semiconductor substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

17. The monolithic three-dimensional memory device of claim 1, wherein the monolithic three-dimensional memory device comprises the second feature.

18. A monolithic three-dimensional memory device comprising:

a plurality of memory stack structures arranged in a hexagonal lattice and located over a substrate, wherein:
the hexagonal lattice structure is defined by hexagons each having a pair of sides that are parallel to a first horizontal direction and perpendicular to a second horizontal direction,
the memory stack structures are located at vertices of the hexagonal lattice, and
each memory stack structure comprises vertically spaced memory elements and a vertical semiconductor channel;
source contact via structures located at each center of a subset of the hexagons that forms a one-dimensional array that extends along the second horizontal direction, each source contact via structure being electrically shorted to a respective source region over, or within, the substrate;
an alternating stack of insulator layers and electrically conductive layers and located over the substrate, wherein the plurality of memory stack structures extends through the alternating stack; and
a plurality of dummy memory stack structures located at each center of another subset of the hexagons, wherein each of the memory stack structure and the dummy memory stack structures comprises a memory film and a vertical semiconductor channel,
wherein:
the electrically conductive layers contact outer sidewalls of the plurality of memory stack structures;
outer sidewalls of the plurality of dummy memory stack structures are laterally spaced from the electrically conductive layers by a vertically spaced stack of dielectric material portions; and
the monolithic three-dimensional memory device further comprises well contact via structures located at each center of yet another subset of hexagons that forms a third one-dimensional array that extends along the second horizontal direction, each well contact via structure being electrically shorted to a doped well having a doping of an opposite conductivity type than the source regions.

19. The monolithic three-dimensional memory device of claim 18, wherein each source region contacts a horizontal portion of a semiconductor channel that also comprises at least one respective vertical semiconductor channel.

20. The monolithic three-dimensional memory device of claim 18, wherein:
each vertical semiconductor channel of the memory stack structures is electrically contacted by a respective overlying contact via structure; and
each dummy memory stack structure does not electrically contact a conductive material portion above a horizontal plane including a bottommost surface of the alternating stack of insulator layers and electrically conductive layers.

21. The monolithic three-dimensional memory device of claim 18, wherein:
each hexagon of the hexagonal lattice has a pair of sides that are parallel to a first horizontal direction and perpendicular to a second horizontal direction; and
the first subset of the hexagons constitutes a first one-dimensional array extending along the second horizontal direction.

22. The monolithic three-dimensional memory device of claim 18, further comprising:
drain contact via structures contacting a respective drain region within the memory stack structures; and
source interconnect via structures contacting a respective source contact via structure,
wherein each top surface of the drain contact via structures and source interconnect via structures contacts a bottom surface of a respective interconnect line structure located within a same horizontal plane.

23. The monolithic three-dimensional memory device of claim 18, wherein each of the source contact via structures and the well contact via structures is laterally surrounded by an insulating spacer that contacts the electrically conductive layers and the insulating layers.

24. The monolithic three-dimensional memory device of claim 18, wherein:
each of the source contact via structures is laterally surrounded by an insulating spacer that contacts the electrically conductive layers and the insulating layers; and
each of the well contact via structures is laterally surrounded by a second vertically spaced stack of dielectric material portions.

25. The monolithic three-dimensional memory device of claim 18, wherein:
the monolithic three-dimensional memory device comprises a vertical NAND memory device;
the electrically conductive layers comprise, or are electrically connected to, a respective word line of the NAND memory device;
the substrate comprises a silicon substrate;
the NAND memory device comprises an array of monolithic three-dimensional NAND strings over the silicon substrate;
at least one memory cell in the first device level of the three-dimensional array of NAND strings is located over another memory cell in the second device level of the three-dimensional array of NAND strings;
the silicon substrate contains an integrated circuit comprising a driver circuit for the memory device located thereon; and
each NAND string comprises:
a plurality of semiconductor channels, wherein at least one end portion of each of the plurality of semiconductor channels extends substantially perpendicular to a top surface of the semiconductor substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

26. The monolithic three-dimensional memory device of claim 18, wherein outer sidewalls of the source contact via structures are laterally spaced from the electrically conductive layers by a vertically spaced stack of dielectric material portions located at each level of the electrically conductive layers, wherein each dielectric material portion continuously extends through a region of the first subset of the hexagons and laterally surrounds each source contact via structure among the plurality of source contact via structures.

27. A monolithic three-dimensional memory device comprising:
a plurality of memory stack structures arranged in a hexagonal lattice and located over a substrate, wherein:

the hexagonal lattice structure is defined by hexagons each having a pair of sides that are parallel to a first horizontal direction and perpendicular to a second horizontal direction, the memory stack structures are located at vertices of the hexagonal lattice, and each memory stack structure comprises vertically spaced memory elements and a vertical semiconductor channel; and source contact via structures located at each center of a subset of the hexagons that forms a one-dimensional array that extends along the second horizontal direction, each source contact via structure being electrically shorted to a respective source region over, or within, the substrate, wherein:

outer sidewalls of the source contact via structures are laterally spaced from the electrically conductive layers by a vertically spaced stack of dielectric material portions located at each level of the electrically conductive layers, wherein each dielectric material portion continuously extends through a region of the first subset of the hexagons and laterally surrounds each source contact via structure among the plurality of source contact via structures; and each dielectric material portion among the vertically spaced stack of dielectric material portions has an undulating width that is measured along the first horizontal direction and changes with a distance along the second horizontal direction.

28. A monolithic three-dimensional memory device, comprising:

a stack of an alternating plurality of insulator layers and electrically conductive layers located over a substrate;

a plurality of memory stack structures located at vertices of hexagons of a hexagonal lattice and over the substrate, wherein each hexagon of the hexagonal lattice has a pair of sides that are parallel to a first horizontal direction and perpendicular to a second horizontal direction; and a plurality of dummy memory stack structures located at each center of a first subset of the hexagons, wherein the first subset of the hexagons constitutes a first one-dimensional array extending along the second horizontal direction, wherein:

each of the memory stack structure and the dummy memory stack structures comprises a memory film and a vertical semiconductor channel;

the electrically conductive layers contact outer sidewalls of the plurality of memory stack structures; and outer sidewalls of the plurality of dummy memory stack structures are laterally spaced from the electrically conductive layers by a vertically spaced stack of dielectric material portions located at each level of the electrically conductive layers, wherein each dielectric material portion among the vertically spaced stack of dielectric material portions continuously extends along the second horizontal direction through a region of the first subset of the hexagons and has an undulating width that is measured along the first horizontal direction and changes with a distance along the second horizontal direction.

29. The monolithic three-dimensional memory device of claim 28, wherein:

each vertical semiconductor channel of the memory stack structures is electrically contacted by a respective overlying contact via structure; and each dummy memory stack structure does not electrically contact a conductive material portion above a horizontal plane including a bottommost surface of the alternating plurality of insulator layers and electrically conductive layers.

30. The monolithic three-dimensional memory device of claim 28, wherein each electrically conductive layer comprises:

a first electrically conductive portion contacting, and located on one side of, a respective dielectric material portion of the vertically spaced stack; and a second electrically conductive portion contacting, and located on an opposite side of, the respective dielectric material portion of the vertically spaced stack, wherein the first electrically conductive portion and the second electrically conductive portion are electrically isolated from each other.

31. The monolithic three-dimensional memory device of claim 28, wherein each dielectric material portion of the vertically spaced stack contacts each outer sidewall of the plurality of dummy memory stack structures.

32. The monolithic three-dimensional memory device of claim 28, wherein the source contact via structures are located at each center of a second subset of hexagons, and each source region contacts a horizontal semiconductor channel within the substrate.

33. The monolithic three-dimensional memory device of claim 32, further comprising well contact via structures located at each center of a third subset of hexagons that forms a third one-dimensional array that extends along the second horizontal direction, each well contact via structure being electrically shorted to a doped well having a doping of an opposite conductivity type than the source regions.

34. The monolithic three-dimensional memory device of claim 33, further comprising:

drain contact via structures contacting a respective drain region within the memory stack structures; and source interconnect via structures contacting a respective source contact via structure, wherein each top surface of the drain contact via structures and source interconnect via structures contacts a bottom surface of a respective interconnect line structure located within a same horizontal plane.

* * * * *